(12) United States Patent
Kasahara

(10) Patent No.: US 8,044,905 B2
(45) Date of Patent: Oct. 25, 2011

(54) TFT ARRANGEMENT FOR DISPLAY DEVICE

(75) Inventor: Takahiro Kasahara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 400 days.

(21) Appl. No.: 12/325,512

(22) Filed: Dec. 1, 2008

(65) Prior Publication Data

US 2009/0140253 A1 Jun. 4, 2009

(30) Foreign Application Priority Data

Dec. 3, 2007 (JP) ................................ 2007-312546

(51) Int. Cl.
*G09G 3/36* (2006.01)
(52) U.S. Cl. ............. 345/92; 345/690; 257/72; 257/202
(58) Field of Classification Search .................... 257/72; 345/92, 690, 694
See application file for complete search history.

(56) References Cited

U.S. PATENT DOCUMENTS

| | | | |
|---|---|---|---|
| 5,132,820 A | 7/1992 | Someya et al. | |
| 5,473,451 A | 12/1995 | Kazurov et al. | |
| 5,479,280 A | 12/1995 | Kazurov et al. | |
| 5,515,187 A | 5/1996 | Nakamura et al. | |
| 5,532,850 A | 7/1996 | Someya et al. | |
| 5,977,940 A | 11/1999 | Akiyama et al. | |
| 5,986,724 A | 11/1999 | Akiyama et al. | |
| 6,066,860 A | 5/2000 | Katayama et al. | |
| 6,072,454 A | 6/2000 | Nakai et al. | |
| 6,310,372 B1 | 10/2001 | Katayama et al. | |
| 6,320,204 B1 | 11/2001 | Hirabayashi et al. | |
| 6,323,871 B1 * | 11/2001 | Fujiyoshi et al. | 345/598 |
| 6,335,778 B1 * | 1/2002 | Kubota et al. | 349/151 |

(Continued)

FOREIGN PATENT DOCUMENTS

JP 64-076034 3/1989

(Continued)

OTHER PUBLICATIONS

Invitation to Pay Additional Fees (Application No. PCT/JP2008/071757) International Searching Authority dated Dec. 22, 2008.

*Primary Examiner* — Kenneth Parker
*Assistant Examiner* — Jose R Diaz
(74) *Attorney, Agent, or Firm* — Eric J. Robinson; Robinson Intellectual Property Law Office, P.C.

(57) ABSTRACT

A new TFT arrangement is demonstrated, which enables prevention of TFT to be formed over a joint portion between the adjacent SOI layers prepared by the process including the separation of a thin single crystal semiconductor layer from a semiconductor wafer. The TFT arrangement is characterized by the structure where a plurality of TFTs each belonging to different pixels is gathered and arranged close to an intersection portion of a scanning line and a signal line. This structure allows the distance between regions, which are provided with the plurality of TFTs, to be extremely large compared with the distance between adjacent TFTs in the conventional TFT arrangement in which all TFTs are arranged in at a regular interval. The formation of a TFT over the joint portion can be avoided by the present arrangement, which leads to the formation of a display device with a negligible amount of display defects.

11 Claims, 16 Drawing Sheets

U.S. PATENT DOCUMENTS

| | | |
|---|---|---|
| 6,403,395 B2 | 6/2002 | Hirabayashi et al. |
| 6,593,626 B2 | 7/2003 | Hirabayashi et al. |
| 6,768,482 B2 * | 7/2004 | Asano et al. ............... 345/90 |
| 7,145,536 B1 | 12/2006 | Yamazaki et al. |
| 7,199,808 B2 * | 4/2007 | Yo .......................... 345/694 |
| 7,301,517 B2 * | 11/2007 | Hebiguchi et al. ........ 345/90 |
| 7,382,384 B2 * | 6/2008 | Winters et al. ............ 345/695 |
| 7,542,024 B2 * | 6/2009 | Koyama .................... 345/107 |
| 7,868,861 B2 * | 1/2011 | Cho et al. .................. 345/87 |
| 7,936,323 B2 * | 5/2011 | Mori et al. ................. 345/87 |
| 2002/0008240 A1 | 1/2002 | Hirabayashi et al. |
| 2002/0093019 A1 | 7/2002 | Hirabayashi et al. |
| 2002/0180902 A1 | 12/2002 | Izumi et al. |
| 2008/0191987 A1 * | 8/2008 | Lee et al. .................. 345/92 |

FOREIGN PATENT DOCUMENTS

| | | |
|---|---|---|
| JP | 02-033031 | 3/1990 |
| JP | 02-234124 | 9/1990 |
| JP | 11-163363 | 6/1999 |
| JP | 2000-241829 | 9/2000 |
| JP | 2003-058080 | 2/2003 |

* cited by examiner

TFT ARRANGEMENT FOR DISPLAY DEVICE

TECHNICAL FIELD

The present invention relates to a display device having a so-called SOI (silicon on insulator) structure in which a semiconductor layer is provided over an insulating surface.

BACKGROUND ART

An integrated circuit has been developed, which uses a semiconductor substrate so-called a silicon-on-insulator (hereinafter also referred to as an SOI) that has a thin single crystal semiconductor layer over an insulating surface, as an alternative to a silicon wafer that is manufactured by thinly slicing an ingot of a single crystal semiconductor. The integrated circuit using the SOI substrate attracts much attention because the use of the SOI substrate enables the reduction of parasitic capacitance between a drain of a transistor and the substrate, which contributes to the improvement in performance of a semiconductor integrated circuit.

There are various methods for manufacturing an SOI substrate, and Smart Cut (registered trademark) is known as a method which allows easy production (high throughput) of SOI substrate having a SOI layer with high quality. The SOI substrate is formed in the following manner: hydrogen ions are implanted into a base wafer which is to be a base of a silicon layer, and the resulting wafer is bonded to another wafer (a bond wafer) at room temperature. A strong bond can be formed between the base wafer and the bond wafer even at room temperature due to van der Waals force. The base wafer bonded to the bond wafer is subjected to heat treatment at a temperature of about 500° C., and a silicon layer is separated from the base wafer utilizing a layer to which the hydrogen ions are implanted as a boundary.

As a method for forming a single crystal silicon thin film obtained by utilizing Smart Cut (registered trademark) over a crystallized glass, which is a high heat resistant glass, a method invented by the applicant of the present invention is known (Patent Document 1: Japanese Published Patent Application No. H11-163363).

Further, a thin film transistor which is included in a driving circuit and a control circuit of a display, such as a liquid crystal display and an organic EL display, is formed of an amorphous silicon film, a polycrystalline silicon film, or the like which is formed over a glass substrate. In recent years, demand for higher definition or higher speed driving of the display has been increased. Therefore, many attempts have been made to form a single crystal silicon film with higher carrier mobility over a glass substrate.

With recent increase in the size of a screen and improvement of productivity by increasing the number of panels obtained from one substrate, the size of mother glass has been increased. For example, although practice application has not been made, a mother glass whose size is 2850 mm×3050 mm (so-called tenth generation) is known as the largest mother glass at the present time.

On the other hand, the largest size of a silicon wafer is 300 mm in diameter. Therefore, in order to form an SOI layer throughout a surface of a large glass substrate a plurality of silicon wafers is required to be bonded. In this case, it is difficult to manufacture a large SOI substrate over the large glass substrate without the formation of a joint portion (gap) between adjacent SOI layers.

DISCLOSURE OF INVENTION

Hereinafter, one dot which emits or transmits light is defined as a sub-pixel and a sub-pixel group formed of a plurality of sub-pixels each of which exhibits a different emitting color is defined as a pixel. For example, each of R (red), G (green), and B (blue) can be a sub-pixel, and a group of these sub-pixels is defined as a pixel.

As a conventional example, FIG. 2 illustrates an example of a pixel structure of an active matrix display device, in which one pixel is formed of three sub-pixels, that is, "a" (also referred to as a first sub-pixel), "b" (also referred to as a second sub-pixel), and "c" (also referred to as a third sub-pixel), and a thin film transistor (hereinafter, referred to as a TFT) as a switching element is provided in each sub-pixel. As illustrated in FIG. 2, the simplest pixel arrangement of a display portion is a pixel arrangement with the three sub-pixels arranged in a stripe pattern. Each sub-pixel is surrounded by wirings including a scanning line and a signal line, and a layout of a TFT and a pixel electrode is all the same in each sub-pixel (for simplification of the drawing, a storage capacitor is not illustrated). Therefore, a distance between adjacent TFTs is equal to a pitch of the sub-pixel.

As to most active matrix display devices, the distance between the neighboring TFTs is short. Therefore, when a display device is manufactured using a large SOI substrate which is formed by bonding a plurality of single crystal semiconductor substrates to a large glass substrate, it is difficult to arrange all TFTs apart from the joint portion. Hence, a sub-pixel in which a TFT cannot be formed or a sub-pixel whose TFT does not operate is frequently formed, which readily causes a display defect such as a point defect and a line defect. Thus, an alignment margin in formation of an SOI layer is small, and high accuracy for alignment of a SOI layer is required.

Further, in order to improve contrast and prevent a leakage current which is caused by the exposure to light, a black matrix (hereinafter, referred to as a BM) is provided over a substrate (hereinafter, referred to as an opposite substrate) which is opposite to a substrate provided with a TFT (hereinafter, referred to as a TFT substrate). In general, a BM is formed to have wide width to obtain a margin for aliment in bonding the TFT substrate with the opposite substrate. Therefore, when the BM is misplaced, a pixel region which is shielded by the BM is enlarged and an aperture ratio is decreased.

The present invention is made in view of the above-described problem and provides a TFT arrangement, by which a margin for alignment in formation of an SOI layer is increased or by which reduction of the aperture ratio due to misplacement in bonding the TFT substrate and the opposite substrate is suppressed. In addition, a display device using the TFT arrangement is provided.

The present invention relates to a display device. One feature of the present invention is that the display device includes a display portion which includes a plurality of pixels arranged in matrix. Each of the pixels includes a plurality of sub-pixels. A plurality of scanning lines or a plurality of signal lines is provided between the adjacent pixels. Alternatively, a plurality of scanning lines and a plurality of signal lines are provided between the adjacent pixels. Furthermore, each of the plurality of sub-pixels is provided with a TFT, and each of the TFTs is arranged so as to be close to an intersection portion of the scanning line and the signal line.

Further, as the arrangement of the TFTs, it is applicable that each of the TFTs is arranged so as to be opposite to an adjacent TFT across a scanning line or a signal line.

That is, in the present invention, a plurality of TFTs, which control the sub-pixels, is arranged collectively so as to surround the intersection portion of the scanning line and the signal line to increase the distance between regions each provided with the plurality of TFTs, whereby the present invention solves the above-described problem. The distance between regions each provided with the plurality of TFTs is large compared with the case where the TFTs are evenly spaced in the display portion, which can prevent the TFT from overlapping with the joint portion between the adjacent SOI layers. Further, the area of the margin of the BM, which is formed so as to be overlapped with the scanning line and the signal line, can be reduced, and reduction of the aperture ratio due to misplacement of the TFT substrate and the opposite substrate can be suppressed.

According to the present invention, increase in the margin for alignment in formation of an SOI layer or suppression of the reduction of the aperture ratio due to misplacement of the TFT substrate and the opposite substrate can be realized, which enables the improvement of productivity and reduction of a display defect.

BEST MODE FOR CARRYING OUT THE INVENTION

Figure 1:
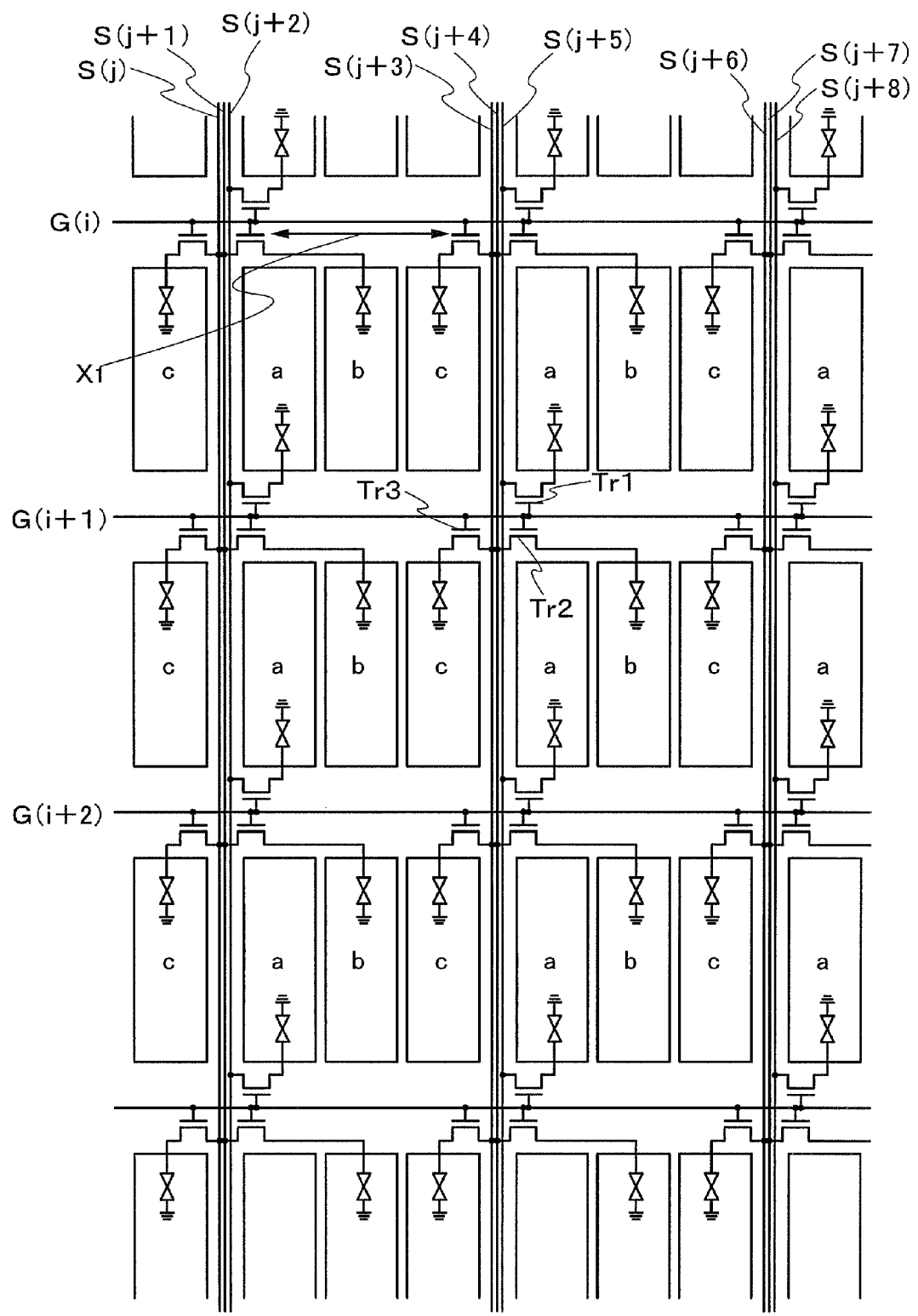
FIG. 1 is a schematic view illustrating a pixel arrangement of a display portion according to the present invention.

Hereinafter, embodiment modes of the present invention will be described with reference to the drawings. Note that, the present invention is not limited to the following description, and it is easily understood by those skilled in the art that various changes may be made in forms and details without departing from the spirit and the scope of the invention. Therefore, the present invention is not to be construed as being limited to the following description of the embodiment modes. Note that, in structures of the present invention described below, reference numerals denoting the same or corresponding elements are used commonly in the drawings.

Embodiment Mode 1

FIG. 1 is a schematic view illustrating an example of a structure of an active matrix display device according to one mode of the present invention. A pixel of this embodiment mode has a structure in which three sub-pixels each having a rectangular shape or a shape similar to the rectangular shape, that is, "a" (also referred to as a first sub-pixel), "b" (also referred to as a second sub-pixel), and "c" (also referred to as a third sub-pixel) are arranged in a stripe pattern so that the long side of the sub-pixel is parallel to a signal line and in which three signal lines are close to each other and interposed between adjacent pixels.

Note that a specific structure of the sub-pixels "a", "b", and "c" is not limited. For example, R (red), G (green), and B (blue) can be applied to the three sub-pixels.

A TFT which is provided at the first sub-pixel of a first pixel arranged in a region surrounded by a scanning line G(i), a scanning line G(i+1), signal lines S(j+3) to S(j+5), and signal lines S(j+6) to S(j+8) is a Tr1 (also referred to as a first thin film transistor), a TFT which is provided at the second sub-pixel of a second pixel provided in a region surrounded by the scanning line G(i+1), a scanning line G(i+2), the signal lines S(j+3) to S(j+5), and the signal lines S(j+6) to S(j+8) is a Tr2 (also referred to as a second thin film transistor), and a TFT which is provided at the third sub-pixel of a third pixel provided in a region surrounded by the scanning line G(i+1), the scanning line G(i+2), signal lines S(j) to S(j+2), the signal lines S(j+3) to S(j+5) is a Tr3 (also referred to as a third thin film transistor). The Tr1 is connected to the scanning line G(i+1) and the signal line S(j+5), the Tr2 is connected to the scanning line G(i+1) and the signal line S(j+4), and the Tr3 is connected to the scanning line G(i+1) and the signal line S(j+3). The same configuration is applied to other pixels, and three TFTs are arranged so as to be close to an intersection portion of a scanning line and three signal lines.

Figure 2:
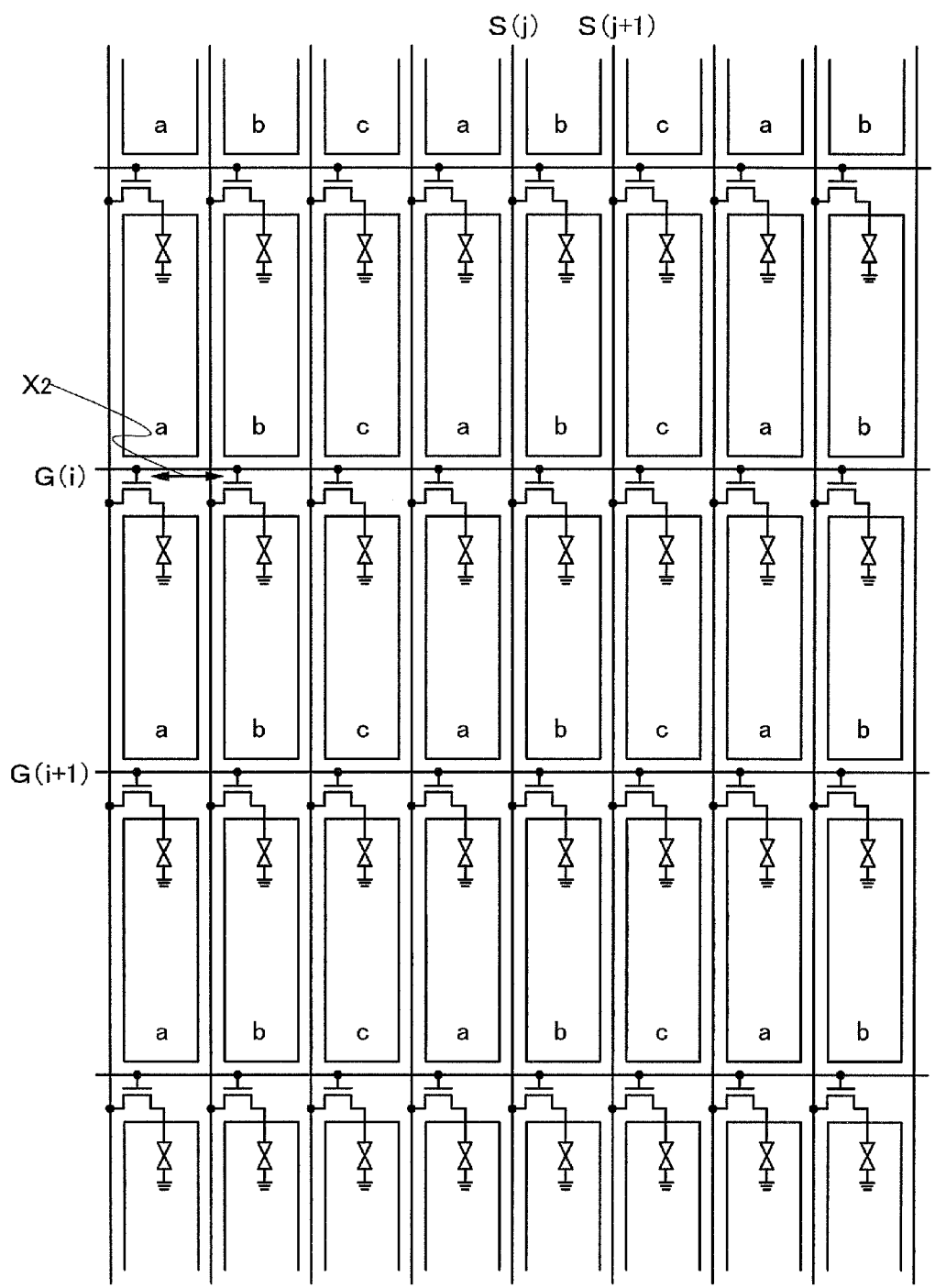
FIG. 2 is a schematic view illustrating a conventional pixel arrangement in a display portion.

The structure of the present embodiment mode can be expressed in a different way as shown below. The pixel shown in the present embodiment mode comprises first to third sub-pixels which are arranged parallel to each other, first to third signal lines (e.g., S(j+1) to S(j+3)) which are arranged parallel to each other, and first and second scanning lines (e.g., G(i) and G(i+1)) which are parallel to each other. The second sub-pixel is sandwiched between the first and third sub-pixels. The first to third signal lines intersect perpendicularly with the first and second scanning lines, the second signal line is interposed between the first and third signal lines, and the first to third sub-pixels are provided in a region surrounded by the second signal line, the third signal line, the first scanning line and the second scanning line. Each of the first to third sub-pixels comprises a TFT. The TFT of the first sub-pixel is operated by the second scanning line and the second signal line, the TFT of the second sub-pixel is operated by the first scanning line and the first signal line, and the TFT of the third sub-pixel is operated by the first scanning line and the third signal line. Furthermore, the TFT of the first sub-pixel is provided nearer to the second signal line than the third signal line and nearer to the second scanning line than the first scanning line. The TFT of the second sub-pixel is provided nearer to the second signal line than the third signal line and nearer to the first scanning line than the second scanning line. The TFT of the third sub-pixel is provided nearer to the third signal line than the second signal line and nearer to the first scanning line than the second scanning line. According to this embodiment mode, apart from the conventional arrangement in which all TFTs are arranged at a regular interval, three TFTs which are included in different pixels are provided close to the intersection portion of three signal lines and one scanning line to form a TFT group. In the TFT group, any of the TFTs is arranged so as to be opposite to other TFTs across the scanning line or the signal line, as illustrated in FIG. 1, whereby a distance between regions each provided with the TFT can be extended to be approximately doubled compared to that of a conventional TFT arrangement illustrated in FIG. 2. Namely, as illustrated in FIGS. 1 and 2, the distance $X_1$ between the TFT groups which comprise three TFTs each belonging to different pixels is larger than the distance $X_2$ between adjacent two TFTs in the conventional TFT arrangement. Therefore, a margin for alignment in formation of an SOI layer is increased.

Figure 12:
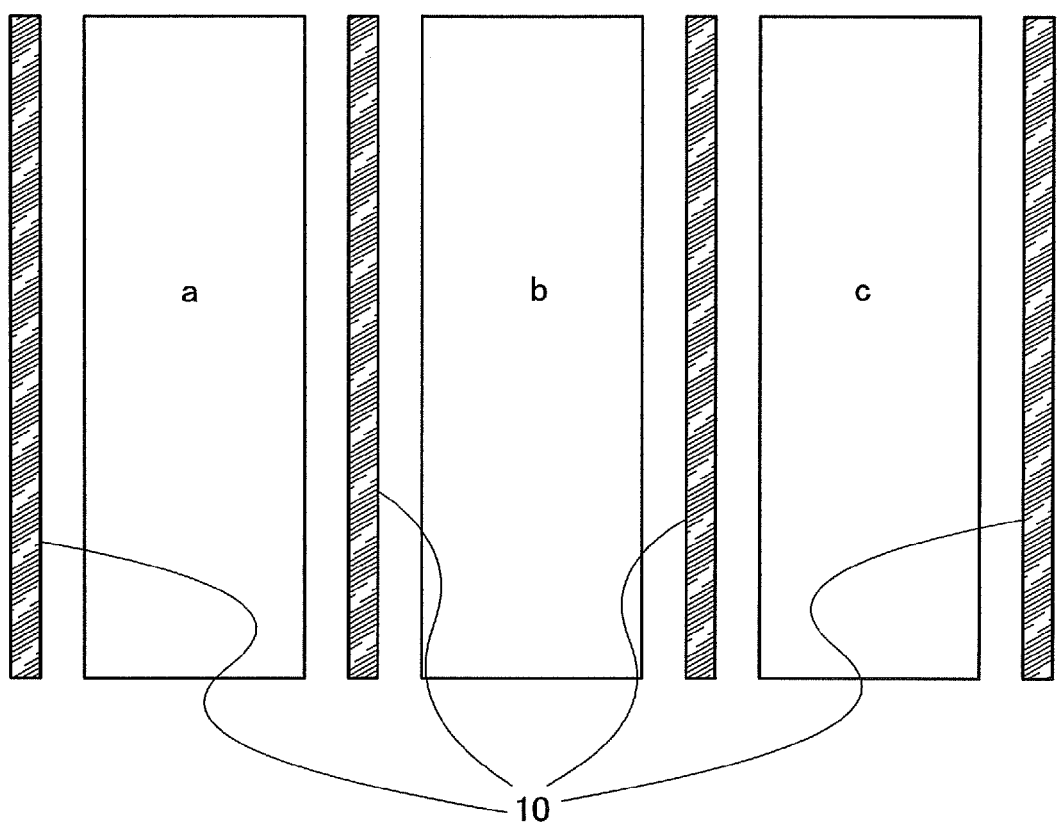
FIG. 12 is a schematic view illustrating a conventional positional relation between a pixel and a BM in a display portion.
Figure 13:
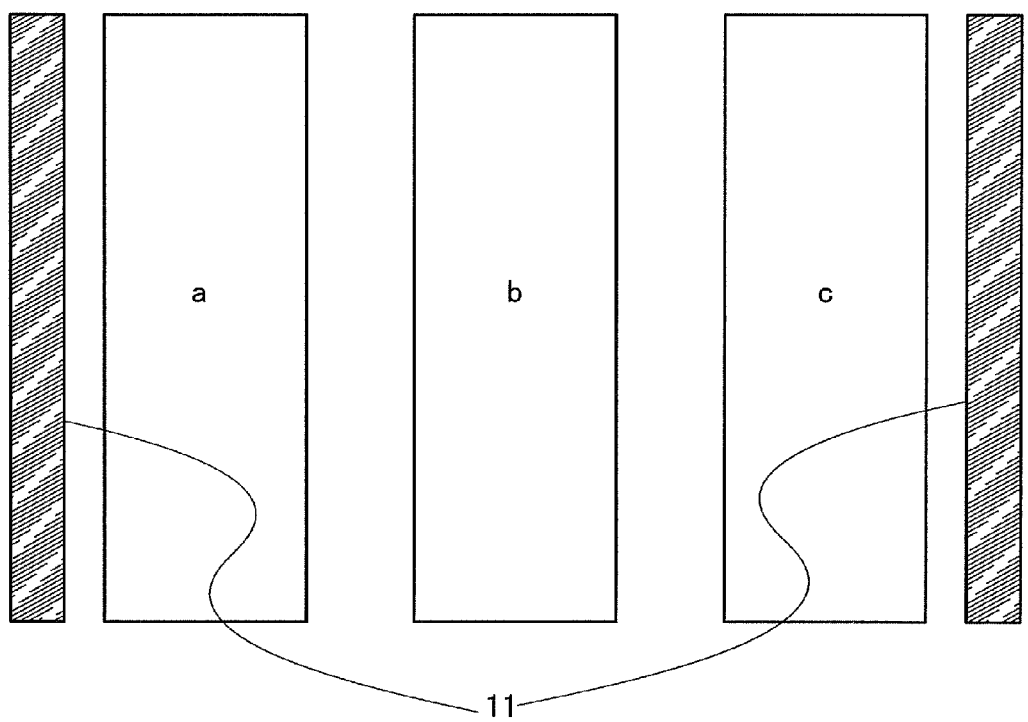
FIG. 13 is a schematic view illustrating a positional relation between a pixel and a BM according to the present invention.

Next, arrangement of the pixel and a BM will be described with reference to FIG. 12 and FIG. 13. FIG. 12 illustrates a positional relation between a BM and a pixel of a conventional display device. FIG. 13 illustrates a positional relation between a BM and a pixel of a display device formed by this embodiment mode. In other words, FIG. 12 corresponds to part of FIG. 2, and FIG. 13 corresponds to part of FIG. 1.

Since a BM 10 is provided over each signal line, a large number of the BMs 10 with relatively narrow width are provided in FIG. 12. In contrast, since a BM 11 is provided over gathered three signal lines, a small number of the BMs 11 with relatively wide width is provided in FIG. 13. When the same number of signal lines is provided over a substrate as in FIG. 12 and FIG. 13, a margin provided in each signal line can be shared in FIG. 13, whereby an area where the BM is formed can be smaller than that of FIG. 12.

That is, since the BM is formed so as to overlap the scanning line and the signal line formed in the pixel where the plurality of signal lines is gathered as in this embodiment mode, the total area of the margin provided in consideration of misplacement of a TFT substrate and an opposite substrate is decreased. Accordingly, reduction of an aperture ratio due to misplacement can be suppressed.

By applying the above-described TFT arrangement, a plurality of thin film transistors each provided in the sub-pixels can be provided close to the intersection portion of the scanning line and the signal line. Therefore, the margin for alignment in formation of the SOI layer can be increased or reduction of the aperture ratio due to the misplacement in bonding the TFT substrate and the opposite substrate can be suppressed.

Embodiment Mode 2

Figure 3:
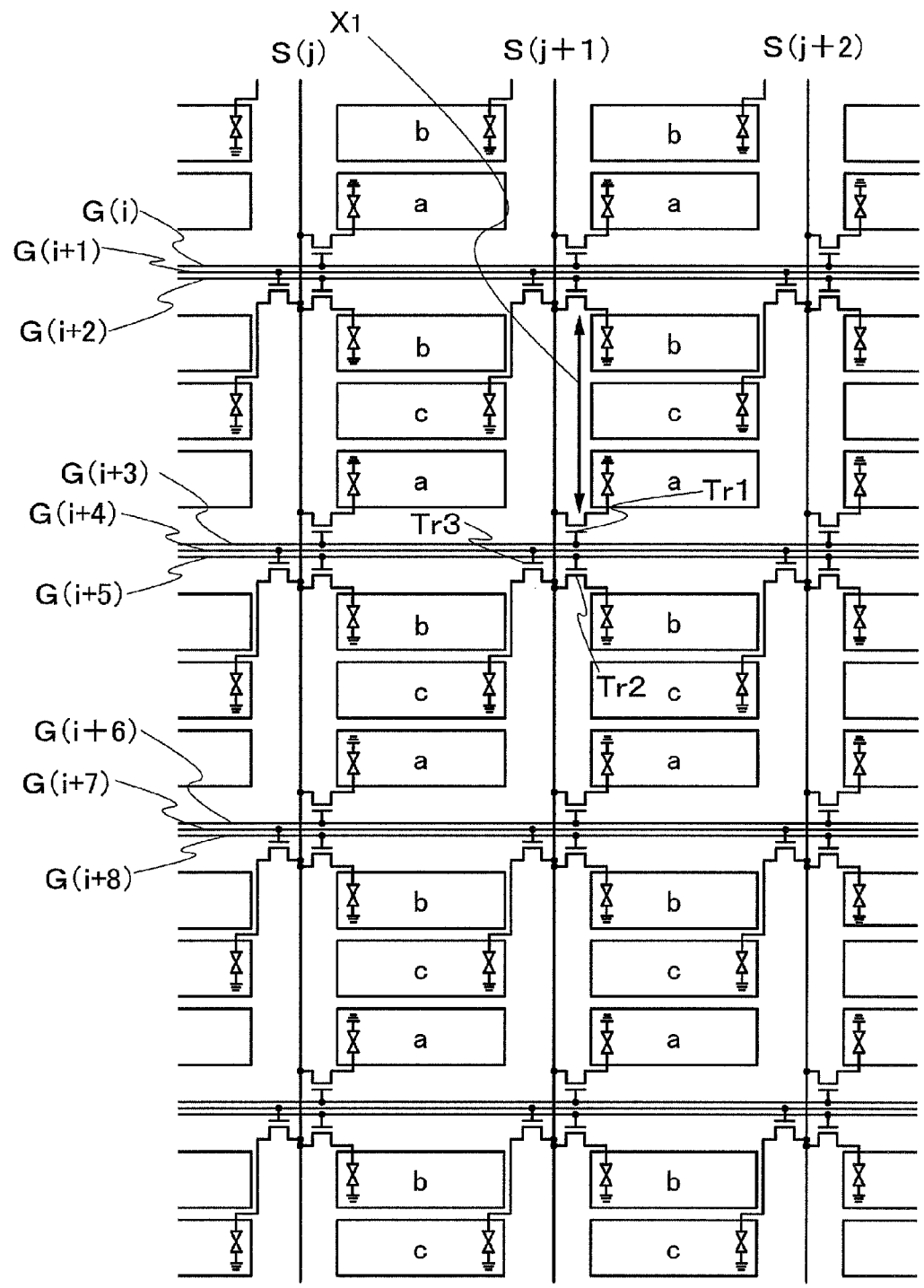
FIG. 3 is a schematic view illustrating a pixel arrangement of a display portion according to the present invention.

FIG. 3 is a schematic view illustrating an example of a structure of an active matrix display device according to one mode of the present invention. A pixel of this embodiment mode has a structure in which three sub-pixels having a rectangular shape or a shape similar to the rectangular shape, that is, "a" (also referred to as a first sub-pixel), "b" (also referred to as a second sub-pixel), and "c" (also referred to as a third sub-pixel) are arranged in a stripe pattern so that the long side of the sub-pixel is parallel to a scanning line and in which three scanning lines are close to each other and interposed between adjacent pixels.

Note that a specific structure of the sub-pixels "a", "b", and "c" is not limited. For example, R (red), G (green), and B (blue) can be applied to the three sub-pixels.

A TFT which is provided at the first sub-pixel of a first pixel arranged in a region surrounded by scanning lines G(i) to G(i+2), scanning lines G(i+3) to G(i+5), a signal line S(j+1), and a signal line S(j+2) is a Tr1 (also referred to as a first thin film transistor), a TFT which is provided at the second sub-pixel of a second pixel provided in a region surrounded by the scanning lines G(i+3) to G(i+5), scanning lines G(i+6) to G(i+8), the signal line S(j+1), and the signal line S(j+2) is a Tr2 (also referred to as a second thin film transistor, and a TFT which is provided at the third sub-pixel of a third pixel provided in a region surrounded by the scanning lines G(i+3) to G(i+5), the scanning lines G(i+6) to G(i+8), a signal line S(j), and the signal line S(j+1) is a Tr3 (also referred to as a third thin film transistor). The Tr1 is connected to the scanning line G(i+3) and the signal line S(j+1), the Tr2 is connected to the scanning line G(i+5) and the signal line S(j+1), and the Tr3 is connected to the scanning line G(i+4) and the signal line S(j+1). The same configuration is applied to other pixels, and three TFTs are arranged so as to be close to an intersection portion of three scanning lines and a signal line.

Figure 4:
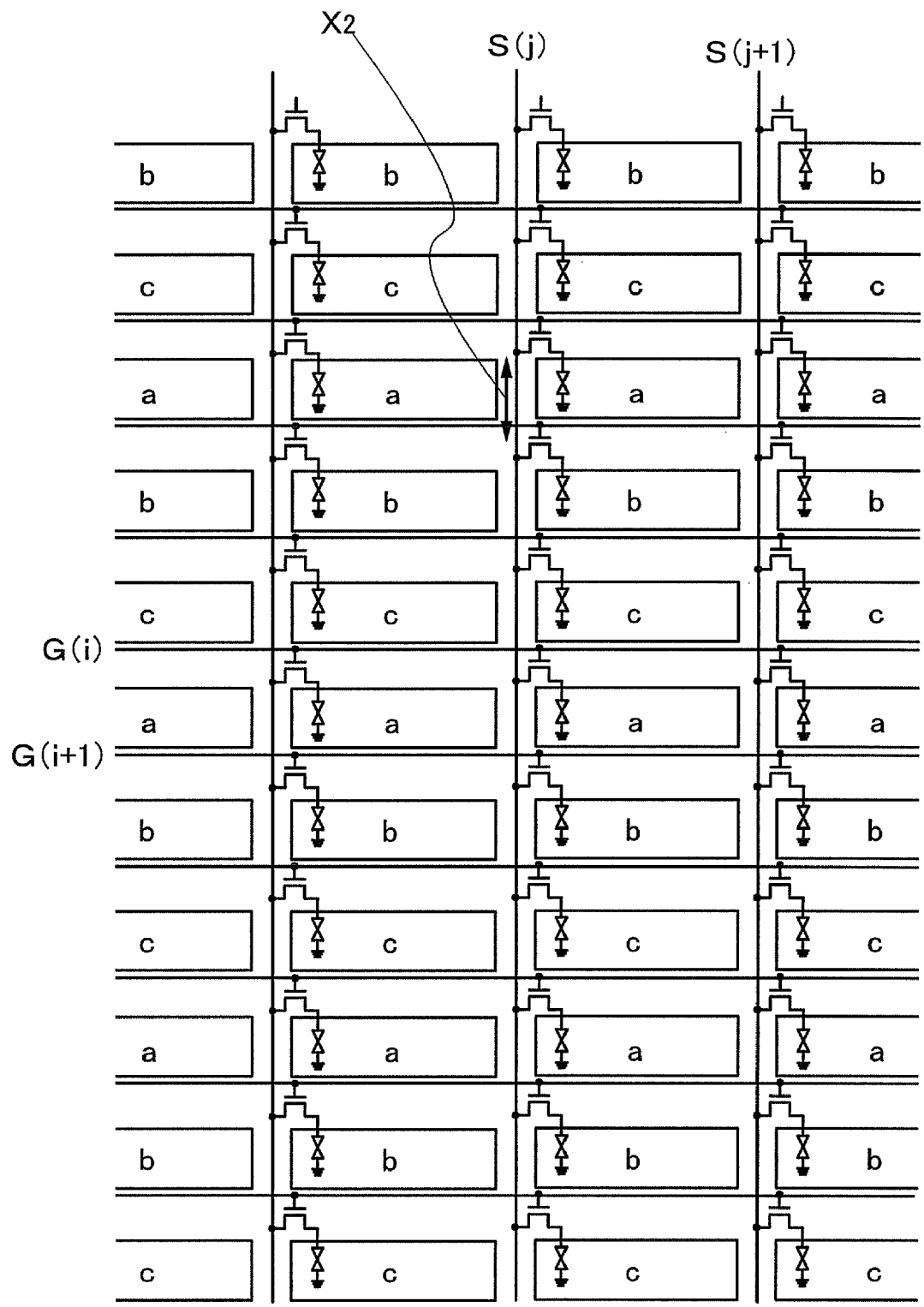
FIG. 4 is a schematic view illustrating a conventional pixel arrangement in a display portion.

The structure of the present embodiment mode can be expressed in a different way as shown below. The pixel shown in the present embodiment mode comprises first to third sub-pixels which are arranged parallel to each other, first and second signal lines (e.g., S(j) and S(j+1)) which are arranged parallel to each other, and first to third scanning lines (e.g., G(i+1) to G(i+3)) which are parallel to each other. The third sub-pixel is sandwiched between the first and second sub-pixels. The first and second signal lines intersect perpendicularly with the first to third scanning lines, the second scanning line is interposed between the first and third scanning lines, and the first to third sub-pixels are provided in a region surrounded by the first signal line, the second signal line, the second scanning line and the third scanning line. Each of the first to third sub-pixels comprises a TFT. The TFT of the first sub-pixel is operated by the third scanning line and the first signal line, the TFT of the second sub-pixel is operated by the second scanning line and the first signal line, and the TFT of the third sub-pixel is operated by the first scanning line and the second signal line. Furthermore, the TFT of the first sub-pixel is provided nearer to the first signal line than the second signal line and nearer to the third scanning line than the second scanning line. The TFT of the second sub-pixel is provided nearer to the first signal line than the second signal line and nearer to the second scanning line than the third scanning line. The TFT of the third sub-pixel is provided nearer to the second signal line than the first signal line and nearer to the second scanning line than the third scanning line. According to this embodiment mode, apart from the conventional arrangement in which all TFTs are arranged at a regular interval, three TFTs which are included in different pixels are provided close to the intersection portion of a signal lines and three scanning lines to form a TFT group. In the TFT group, any of the TFTs is arranged so as to be opposite to other TFTs across the scanning line or the signal line as illustrated in FIG. 3, whereby a distance between regions each provided with the TFT can be extended to be approximately doubled compared to that of a conventional TFT arrangement illustrated in FIG. 4. Namely, as illustrated in FIGS. 3 and 4; the distance $X_1$ between the TFT groups which comprise three TFTs each belonging to different pixels is larger than the distance $X_2$ between two TFTs in the conventional TFT arrangement. Therefore, a margin for alignment in formation of an SOI layer is increased.

Further, since a BM which is formed so as to overlap the scanning line and the signal line formed in the pixel where the plurality of scanning lines is gathered as in the present invention, the total area of the margin provided in consideration of misplacement of a TFT substrate and an opposite substrate can be decreased. Accordingly, reduction of an aperture ratio due to misplacement can be suppressed.

By applying the above-described TFT arrangement, a plurality of thin film transistors each provided in the sub-pixels can be provided close to the intersection portion of the scanning line and the signal line. Therefore, the margin for alignment in formation of an SOI layer can be increased or reduction of the aperture ratio due to the misplacement in bonding the TFT substrate and the opposite substrate can be suppressed.

Embodiment Mode 3

Figure 5:
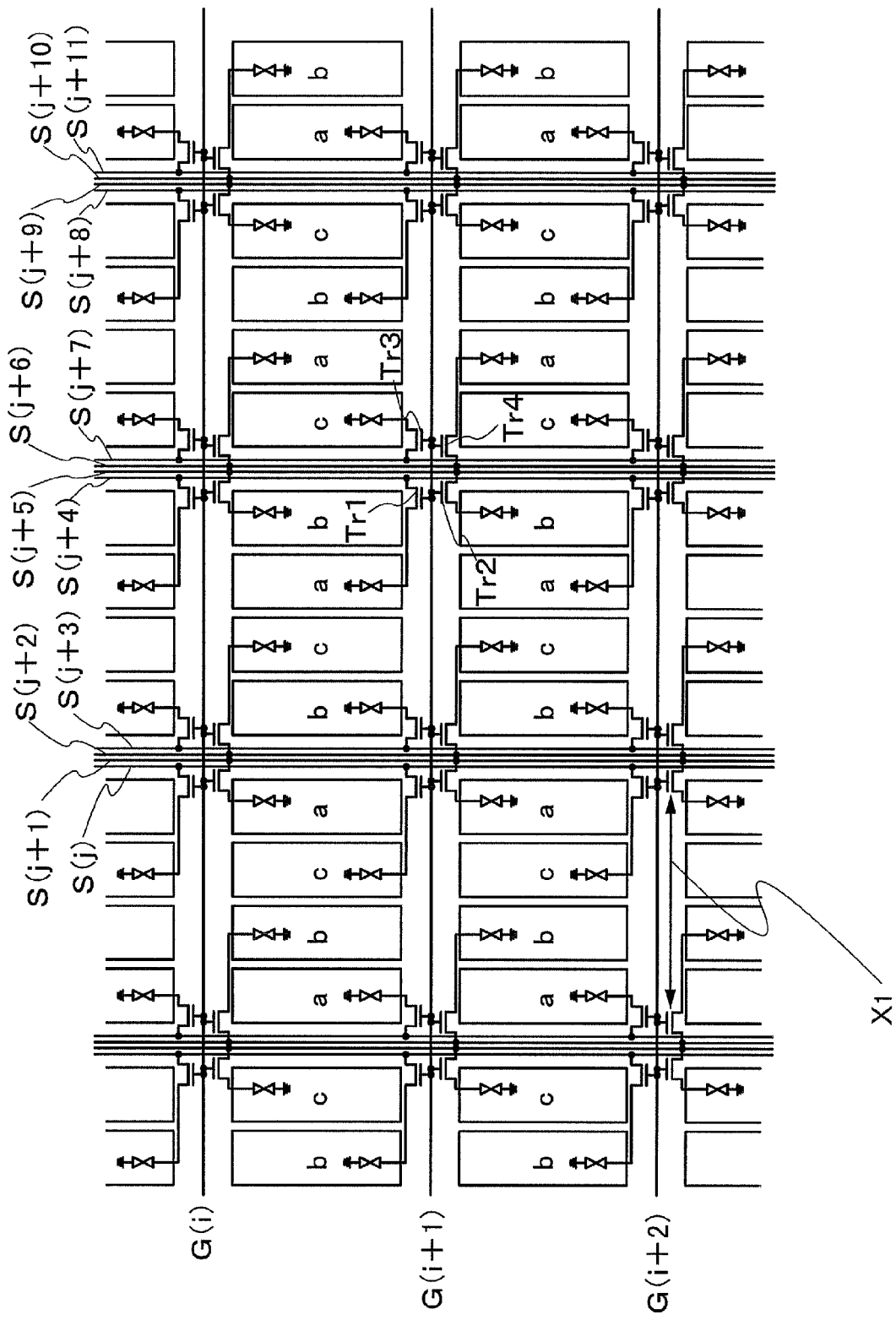
FIG. 5 is a schematic view illustrating a pixel arrangement of a display portion according to the present invention.

FIG. 5 is a view illustrating an example of a structure in which four TFTs are arranged in the periphery of an intersection portion of a scanning line and a signal line in an active matrix display device. A pixel of this embodiment mode has a structure in which three sub-pixels each having a rectangular shape or a shape similar to the rectangular shape, that is, "a" (also referred to as a first sub-pixel), "b" (also referred to as a second sub-pixel), and "c" (also referred to as a third sub-pixel) are arranged in a stripe pattern so that the long side of the sub-pixel is parallel to a signal line and in which four signal lines are close to each other and interposed between adjacent pixels.

In other words, the pixel of this embodiment mode has a structure in which four sub-pixels having a rectangular shape or a shape similar to the rectangular shape, that is, "a" (also referred to as a first sub-pixel), "b" (also referred to as a second sub-pixel),"c" (also referred to as a third sub-pixel), and "α" (also referred to as a fourth sub-pixel (α=a, b, or c)) are arranged in a stripe pattern so that the long side of the sub-pixel is parallel to the signal line and in which the four signal lines are gathered and interposed between adjacent pixels.

Note that a specific structure of the sub-pixels "a", "b", and "c" is not limited. For example, R (red), G (green), and B (blue) can be applied to the three sub-pixels.

The four sub-pixels are arranged within a lattice formed by the scanning line and the signal line. Therefore, taking a given row (i-row) for example, sub-pixels for four pixels (twelve sub-pixels) are arranged with three lattices lining successively along a row direction as a unit.

A TFT which is provided at the first sub-pixel of a first pixel arranged in a region surrounded by a scanning line G(i), a scanning line G(i+1), signal lines S(j) to S(j+3), and signal lines S(j+4) to S(j+7) is a Tr1 (also referred to as a first thin film transistor), a TFT which is provided at the second sub-pixel of a second pixel provided in a region surrounded by the scanning lines G(i+1), a scanning line G(i+2), the signal lines S(j) to S(j+3), and the signal lines S(j+4) to S(j+7) is a Tr2 (also referred to as a second thin film transistor), a TFT which is provided at the third sub-pixel of a third pixel provided in a region surrounded by the scanning line G(i), the scanning line G(i+1), the signal lines S(j+4) to S(j+7), and signal lines S(j+8) to S(j+11) is a Tr3 (also referred to as a third thin film transistor), and a TFT which is provided at the fourth sub-pixel of a fourth pixel arranged in a region surrounded by the scanning line G(i+1), the scanning line G(i+2), the signal lines S(j+4) to S(j+7), and the signal lines S(j+8) to S(j+11) is a Tr4 (also referred to as a fourth thin film transistor). The Tr1 is connected to the scanning line G(i+1) and the signal line S(j+4), the Tr2 is connected to the scanning line G(i+1) and the signal line S(j+5), the Tr3 is connected to the scanning line G(i+1) and the signal line S(j+7), and the Tr4 is connected to the scanning line G(i+1) and the signal line S(j+6). The same configuration is applied to other pixels, and four TFTs are arranged so as to be close to an intersection portion of a scanning line and four signal lines.

Note that although the structure in which the sub-pixel is arranged in a stripe pattern so that the long side of the sub-pixel is parallel to the signal line and in which the four signal lines are gathered is illustrated in this embodiment mode, the four TFTs may be arranged close to the intersection portion of the scanning line and the signal line even in a structure in which the sub-pixel is arranged in a stripe pattern so that the long side of the sub-pixel is parallel to the scanning line and in which the four scanning lines are gathered (not shown).

The structure of the present embodiment mode can be expressed in a different way as shown below. The pixel shown in the present embodiment mode comprises first to fourth sub-pixels which are arranged parallel to each other, first to fourth signal lines (e.g., S(j+2) to S(j+5)) which are arranged parallel to each other, and first and second scanning (e.g., G(i) and G(i+1)) lines which are parallel to each other. The first and third sub-pixels are sandwiched between the second and fourth sub-pixels, the third sub-pixel is nearer to the second sub-pixel than the fourth sub-pixel, and the first sub-pixel is nearer to the fourth sub-pixel than the second sub-pixel. The first to fourth signal lines intersect perpendicularly with the first and second scanning lines, the second signal line and third signal line are interposed between the first and fourth signal lines, the second signal line is nearer to the first signal line than the fourth signal line, and the third signal line is nearer to the fourth signal line than the first signal line. The first to fourth sub-pixels are provided in a region surrounded by the second signal line, the third signal line, the first scanning line and the second scanning line. Each of the first to fourth sub-pixels comprises a TFT. The TFT of the first sub-pixel is operated by the second scanning line and the third signal line, the TFT of the second sub-pixel is operated by the second scanning line and the second signal line, the TFT of the third sub-pixel is operated by the first scanning line and the first signal line, and the TFT of the fourth sub-pixel is operated by the first scanning line and the fourth signal line. Furthermore, the TFT of the first sub-pixel is provided nearer to the third signal line than the second signal line and nearer to the second scanning line than the first scanning line. The TFT of the second sub-pixel is provided nearer to the second signal line than the third signal line and nearer to the second scanning line than the first scanning line. The TFT of the third sub-pixel is provided nearer to the second signal line than the third signal line and nearer to the first scanning line than the second scanning line. The TFT of the fourth sub-pixel is provided nearer to the third signal line than the second signal line and nearer to the first scanning line than the second scanning line. According to this embodiment mode, apart from the conventional arrangement in which all TFTs are arranged at a regular interval, four TFTs which are included in different pixels are provided close to the intersection portion of four signal lines and one scanning line to form a TFT group. In the TFT group, any of the TFTs is arranged so as to be opposite to other TFTs across the scanning line or the signal line as illustrated in FIG. 5, whereby a distance between regions each provided with the TFT can be extended to be approximately trebled compared to a conventional TFT arrangement illustrated in FIG. 2. Namely, as illustrated in FIG. 5, the distance $X_1$ between TFT groups which comprise four TFTs each belonging to different pixels can be larger than the distance between adjacent TFTs in the conventional TFT arrangement. Therefore, a margin for alignment in formation of an SOI layer is increased.

Further, since a BM which is formed so as to overlap the scanning line and the signal line formed in the pixel where the plurality of scanning lines or the plurality of signal lines is gathered as in the present invention, the total area of the margin provided in consideration of misplacement of a TFT substrate and an opposite substrate can be decreased. Accordingly, reduction of an aperture ratio due to the misplacement can be suppressed.

By applying the above-described TFT arrangement, a plurality of the thin film transistors each provided in the sub-pixel can be provided close to the intersection portion of the scanning line and the signal line. Therefore, the margin for alignment in formation of an SOI layer can be increased or reduction of the aperture ratio due to misplacement in bonding the TFT substrate and the opposite substrate can be suppressed.

Embodiment Mode 4

Figure 6:
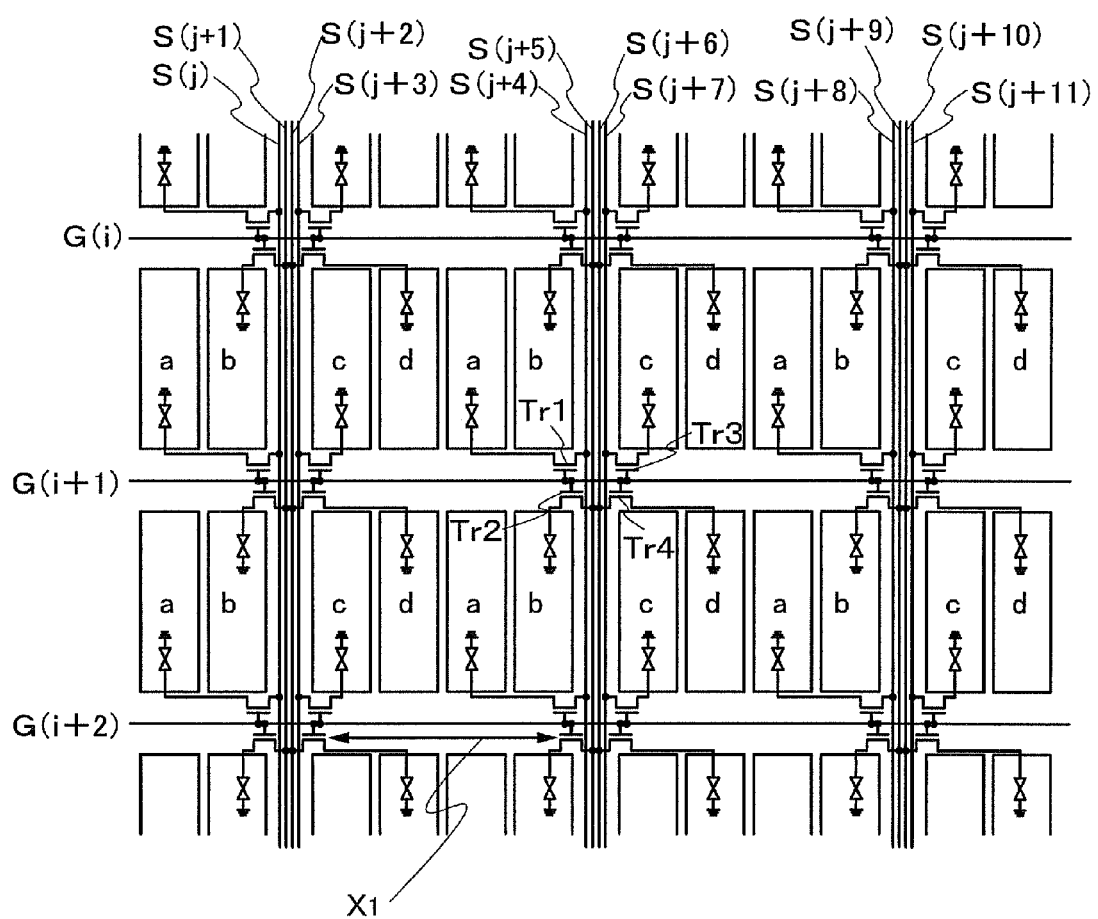
FIG. 6 is a schematic view illustrating a pixel arrangement of a display portion according to the present invention.

FIG. 6 is a view illustrating an example of a structure in which four TFTs are arranged in the periphery of an intersection portion of a scanning line and a signal line in an active matrix display device. A pixel of this embodiment mode has a structure in which four sub-pixels having a rectangular shape or a shape similar to rectangular shape, that is, "a" (also referred to as a first sub-pixel), "b" (also referred to as a second sub-pixel), "c" (also referred to as a third sub-pixel), and "d" (also referred to as a fourth sub-pixel) are arranged in a stripe pattern so that the long side of the sub-pixel is parallel to the signal line and in which the four signal lines are close to each other and interposed between adjacent pixels.

Note that a specific structure of the sub-pixels "a", "b", "c", and "d" is not limited. For example, R (red), G (green), B (blue), and W (white) can be applied to the four sub-pixels.

A TFT which is provided at the first sub-pixel of a first pixel arranged in a region surrounded by a scanning line G(i), a scanning line G(i+1), signal lines S(j) to S(j+3), and signal lines S(j+4) to S(j+7) is a Tr1 (also referred to as a first thin film transistor), a TFT which is provided at the second sub-pixel of a second pixel provided in a region surrounded by the scanning line G(i+1), a scanning line G(i+2), the signal lines S(j) to S(j+3), and the signal lines S(j+4) to S(j+7) is a Tr2 (also referred to as a second thin film transistor, a TFT which is provided at the third sub-pixel of a third pixel provided in a region surrounded by the scanning line G(i), the scanning line G(i+1), the signal lines S(j+4) to S(j+7), and signal lines S(j+8) to S(j+11) is a Tr3 (also referred to as a third thin film transistor), and a TFT which is provided at the fourth sub-pixel of a fourth pixel arranged in a region surrounded by the scanning line G(i+1), the scanning line G(i+2), the signal lines S(j+4) to S(j+7), and the signal lines S(j+8) to S(j+11) is a Tr4 (also referred to as a fourth thin film transistor). The Tr1 is connected to the scanning line G(i+1) and the signal line S(j+4), the Tr2 is connected to the scanning line G(i+1) and the signal line S(j+5), the Tr3 is connected to the scanning line G(i+1) and the signal line S(j+7), and the Tr4 is connected to the scanning line G(i+1) and the signal line S(j+6). The same configuration is applied to other pixels, and four TFTs are arranged so as to be close to an intersection portion of a scanning line and four signal lines.

Note that although the structure in which the sub-pixel is arranged in a stripe pattern so that the long side of the sub-pixel is parallel to the signal line and in which the four signal lines are gathered is illustrated in this embodiment mode, the four TFTs can be arranged in the intersection portion of the scanning line and the signal line even in a structure in which the sub-pixel is arranged in a stripe pattern so that the long side of the sub-pixel is parallel to the scanning line and in which four scanning lines are gathered (not shown).

The structure of the present embodiment mode can be expressed in a different way as shown below. The pixel shown in the present embodiment mode comprises first to fourth sub-pixels which are arranged parallel to each other, first to fourth signal lines (e.g., S(j+2) to S(j+5)) which are arranged parallel to each other, and first and second scanning lines (e.g., G(i) and G(i+1)) which are parallel to each other. The first and fourth sub-pixels are sandwiched between the second and third sub-pixels, the first sub-pixel is nearer to the second sub-pixel than the third sub-pixel, and the fourth sub-pixel is nearer to the third sub-pixel than the second sub-pixel. The first to fourth signal lines intersect perpendicularly with the first and second scanning lines, the second signal line and third signal line are interposed between the first and fourth signal lines, the second signal line is nearer to the first signal line than the fourth signal line, and the third signal line is nearer to the fourth signal line than the first signal line. The first to fourth sub-pixels are provided in a region surrounded by the second signal line, the third signal line, the first scanning line and the second scanning line. Each of the first to fourth sub-pixels comprises a TFT. The TFT of the first sub-pixel is operated by the second scanning line and the third signal line, the TFT of the second sub-pixel is operated by the first scanning line and the fourth signal line, the TFT of the third sub-pixel is operated by the second scanning line and the second signal line, and the TFT of the fourth sub-pixel is operated by the first scanning line and the first signal line. Furthermore, the TFT of the first sub-pixel is provided nearer to the third signal line than the second signal line and nearer to the second scanning line than the first scanning line. The TFT of the second sub-pixel is provided nearer to the third signal line than the second signal line and nearer to the first scanning line than the second scanning line. The TFT of the third sub-pixel is provided nearer to the second signal line than the third signal line and nearer to the second scanning line than the first scanning line. The TFT of the fourth sub-pixel is provided nearer to the second signal line than the third signal line and nearer to the first scanning line than the second scanning line. According to this embodiment mode, apart from the conventional arrangement in which all TFTs are arranged at a regular interval, four TFTs which are included in different pixels are provided close to the intersection portion of four signal lines and one scanning line to form a TFT group. In the TFT group, any of the TFTs is arranged so as to be opposite to other TFTs across the scanning line or the signal line as illustrated in FIG. 6, whereby a distance between regions each provided with the TFT can be increased compared to that of a conventional TFT arrangement. Namely, as illustrated in FIG. 6, the distance $X_1$ between TFT groups which comprise four TFTs each belonging to different pixels is larger than the distance between TFTs in the conventional TFT arrangement. Therefore, a margin for alignment in formation of an SOI layer is increased.

Further, since a BM which is formed so as to overlap the scanning line and the signal line formed in the pixel where the plurality of scanning lines, the plurality of signal lines, or the plurality of scanning lines and the plurality of signal lines are gathered as in the present invention, the total area of the margin provided in consideration of misplacement of a TFT substrate and an opposite substrate can be decreased. Accordingly, reduction of an aperture ratio due to misplacement can be suppressed.

By applying the above-described TFT arrangement, a plurality of thin film transistors each provided in the sub-pixels can be provided close to the intersection portion of the scanning line and the signal line. Therefore, the margin for alignment in formation of an SOI layer can be increased or reduction of the aperture ratio due to misplacement in bonding the TFT substrate and the opposite substrate can be suppressed.

Embodiment Mode 5

Figure 7:
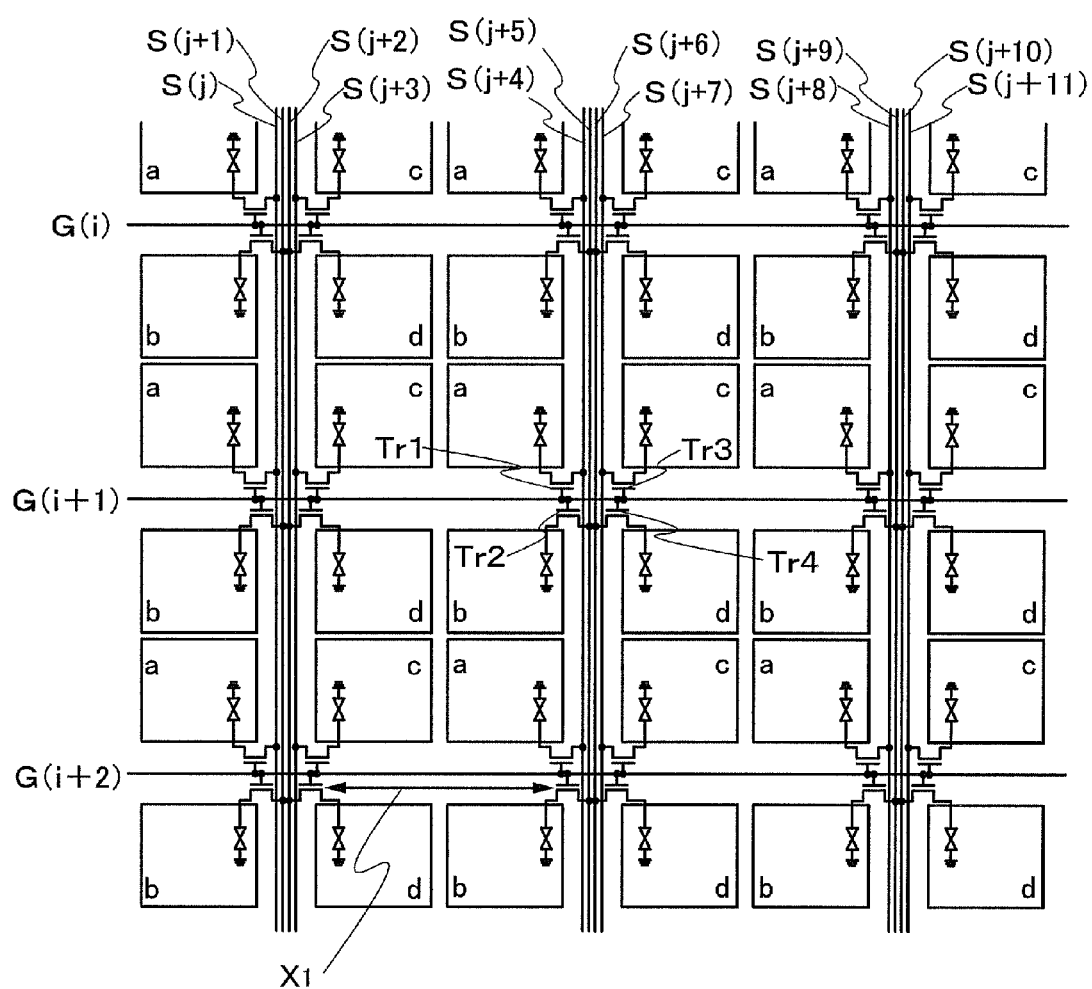
FIG. 7 is a schematic view illustrating a pixel arrangement of a display portion according to the present invention.

FIG. 7 is a view illustrating an example of a structure in which four TFTs are arranged in the periphery of an intersection portion of a scanning line and a signal line in an active matrix display device. A pixel of this embodiment mode has a structure in which four sub-pixels having a square or similar to a square shape, that is, "a" (also referred to as a first sub-pixel), "b" (also referred to as a second sub-pixel), "c" (also referred to as a third sub-pixel), and "d" (also referred to as a fourth sub-pixel) are arranged in a mosaic pattern and in which four signal lines are close to each other and interposed between adjacent pixels.

Note that a specific structure of the sub-pixels "a", "b", "c", and "d" is not limited. For example, R (red), G (green), B (blue), and W (white) can be applied to the four sub-pixels.

A TFT which is provided at the first sub-pixel of a first pixel arranged in a region surrounded by a scanning line G(i), a scanning line G(i+1), signal lines S(j) to S(j+3), and signal lines S(j+4) to S(j+7) is a Tr1 (also referred to as a first thin film transistor), a TFT which is provided at the second sub-pixel of a second pixel provided in a region surrounded by the scanning line G(i+1), a scanning line G(i+2), the signal lines S(j) to S(j+3), and the signal lines S(j+4) to S(j+7) is a Tr2 (also referred to as a second thin film transistor), a TFT which is provided at the third sub-pixel of a third pixel provided in a region surrounded by the scanning line G(i), the scanning line G(i+1), the signal lines S(j+4) to S(j+7), and signal lines S(j+8) to S(j+11) is a Tr3 (also referred to as a third thin film transistor), and a TFT which is provided at the fourth sub-pixel of a fourth pixel arranged in a region surrounded by the scanning line G(i+1), the scanning line G(i+2), the signal lines S(j+4) to S(j+7), and the signal lines S(j+8) to S(j+11) is a Tr4 (also referred to as a fourth thin film transistor). The Tr1 is connected to the scanning line G(i+1) and the signal line S(j+4), the Tr2 is connected to the scanning line G(i+1) and the signal line S(j+5), the Tr3 is connected to the scanning line G(i+1) and the signal line S(j+7), and the Tr4 is connected to the scanning line G(i+1) and the signal line S(j+6). The same configuration is applied to other pixels, and four TFTs are arranged so as to be close to an intersection portion of a scanning line and four signal lines.

Note that although the structure in which the four signal lines are gathered is illustrated in this embodiment mode, the four TFTs can be arranged close to the intersection portion of the scanning line and the signal line even in a structure in which four scanning lines are gathered (not shown). Further, by gathering two scanning lines and two signal lines, a similar TFT arrangement can be realized as illustrated in FIG. 8.

The structure of the present embodiment mode illustrated in FIG. 7 can be expressed in a different way as shown below. The pixel shown in the present embodiment mode of FIG. 7 comprises first to fourth sub-pixels which are arranged in a mosaic pattern, first to fourth signal lines (e.g., S(j+2) to S(j+5)) which are arranged parallel to each other, and first and second scanning lines (e.g., G(i) to G(i+1)) which are parallel to each other. The first sub-pixel is nearer to the second scanning line than the first scanning line and nearer to the third signal line than the second signal line. The second sub-pixel is nearer to the first scanning line than the second scanning line and nearer to the third signal line than the second signal line. The third sub-pixel is nearer to the second scanning line than the first scanning line and nearer to the second signal line than the third signal line. The fourth sub-pixel is nearer to the first scanning line than the second scanning line and nearer to the second signal line than the third signal line. The first to fourth signal lines intersect perpendicularly with the first and second scanning lines, the second signal line and third signal line are interposed between the first and fourth signal lines, the second signal line is nearer to the first signal line than the fourth signal line, and the third signal line is nearer to the fourth signal line than the first signal line. The first to fourth sub-pixels are provided in a region surrounded by the second signal line, the third signal line, the first scanning line and the second scanning line. Each of the first to fourth sub-pixels comprises a TFT. The TFT of the first sub-pixel is operated by the second scanning line and the third signal line, the TFT of the second sub-pixel is operated by the first scanning line and the fourth signal line, the TFT of the third sub-pixel is operated by the second scanning line and the second signal line, and the TFT of the fourth sub-pixel is operated by the first scanning line and the first signal line. Furthermore, the TFT of the first sub-pixel is provided nearer to the third signal line than the second signal line and nearer to the second scanning line than the first scanning line. The TFT of the second sub-pixel is provided nearer to the third signal line than the second signal line and nearer to the first scanning line than the second scanning line. The TFT of the third sub-pixel is provided nearer to the second signal line than the third signal line and nearer to the second scanning line than the first scanning line. The TFT of the fourth sub-pixel is provided nearer to the second signal line than the third signal line and nearer to the first scanning line than the second scanning line. In a similar way, the structure of the present embodiment mode illustrated in FIG. 8 can be expressed as shown below. A pixel comprises first to fourth sub-pixels which are arranged in a mosaic pattern, first and second signal lines (e.g., S(j+1) and S(j+2)) which are arranged parallel to each other, and first and second scanning lines (e.g., G(i+1) and G(i+2)) which are parallel to each other. The first sub-pixel is nearer to the first scanning line than the second scanning line and nearer to the first signal line than the second signal line. The second sub-pixel is nearer to the first scanning line than the second scanning line and nearer to the second signal line than the first signal line. The third sub-pixel is nearer to the second scanning line than the first scanning line and nearer to the first signal line than the second signal line. The fourth sub-pixel is nearer to the second scanning line than the first scanning line and nearer to the second signal line than the first signal line. The first and second signal lines intersect perpendicularly with the first and second scanning lines. The first to fourth sub-pixels are provided in a region surrounded by the first signal line, the second signal line, the first scanning line and the second scanning line. Each of the first to fourth sub-pixels comprises a TFT. The TFT of the first sub-pixel is operated by the first scanning line and the first signal line, the TFT of the second sub-pixel is operated by the first scanning line and the second signal line, the TFT of the third sub-pixel is operated by the second scanning line and the first signal line, and the TFT of the fourth sub-pixel is operated by the second scanning line and the second signal line. Furthermore, the TFT of the first sub-pixel is provided nearer to the first signal line than the second signal line and nearer to the first scanning line than the second scanning line. The TFT of the second sub-pixel is provided nearer to the second signal line than the first signal line and nearer to the first scanning line than the second scanning line. The TFT of the third sub-pixel is provided nearer to the first signal line than the second signal line and nearer to the second scanning line than the first scanning line. The TFT of the fourth sub-pixel is provided nearer to the second signal line than the first signal line and nearer to the second scanning line than the first scanning line. According to this embodiment mode, apart from the conventional arrangement in which all TFTs are arranged at a regular interval, four TFTs which are included in different pixels are provided close to the intersection portion of four signal lines and one scanning line or to the intersection portion of two signal lines and two scanning line to form a TFT group. In the TFT group, any of the TFTs is arranged so as to be, opposite to the other TFTs across the scanning line or the signal line as illustrated in. FIG. 7 and FIG. 8, whereby a distance between regions each provided with the TFT can be extended to be approximately doubled compared to a conventional TFT arrangement illustrated in FIG. 9. Namely, as illustrated in FIGS. 7 to 9, the distance. $X_1$ between two TFT groups which comprise four TFTs each belonging to different pixels can be larger than the distance $X_2$ between TFTs in the conventional TFT arrangement. Therefore, a margin for alignment in formation of an SOI layer is increased. In addition, the pixels are arranged in a mosaic pattern as illustrated in FIG. 7 and FIG. 8, whereby a secondary effect of increasing visibility can also be obtained.

Figure 8:
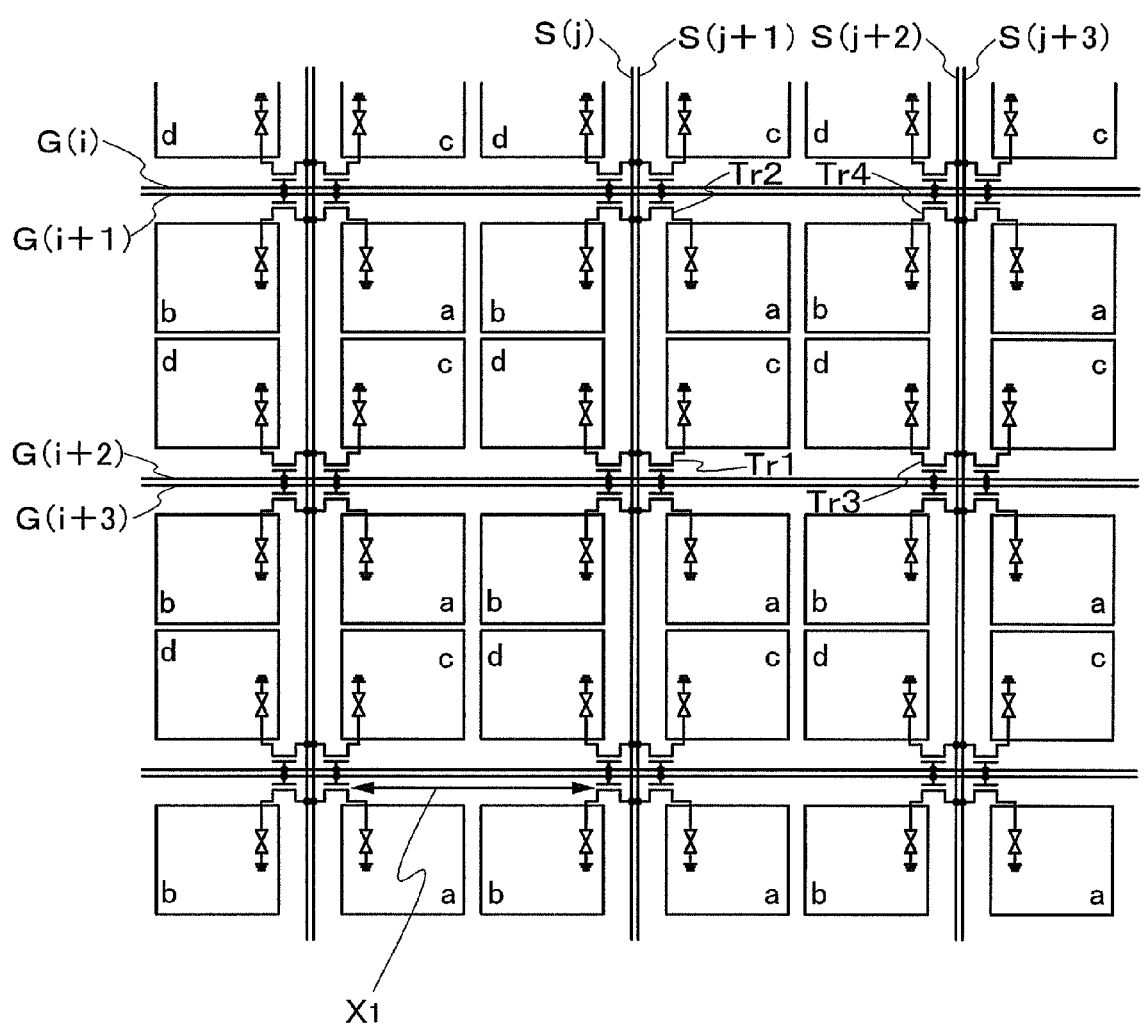
FIG. 8 is a schematic view illustrating a pixel arrangement of a display portion according to the present invention.
Figure 9:
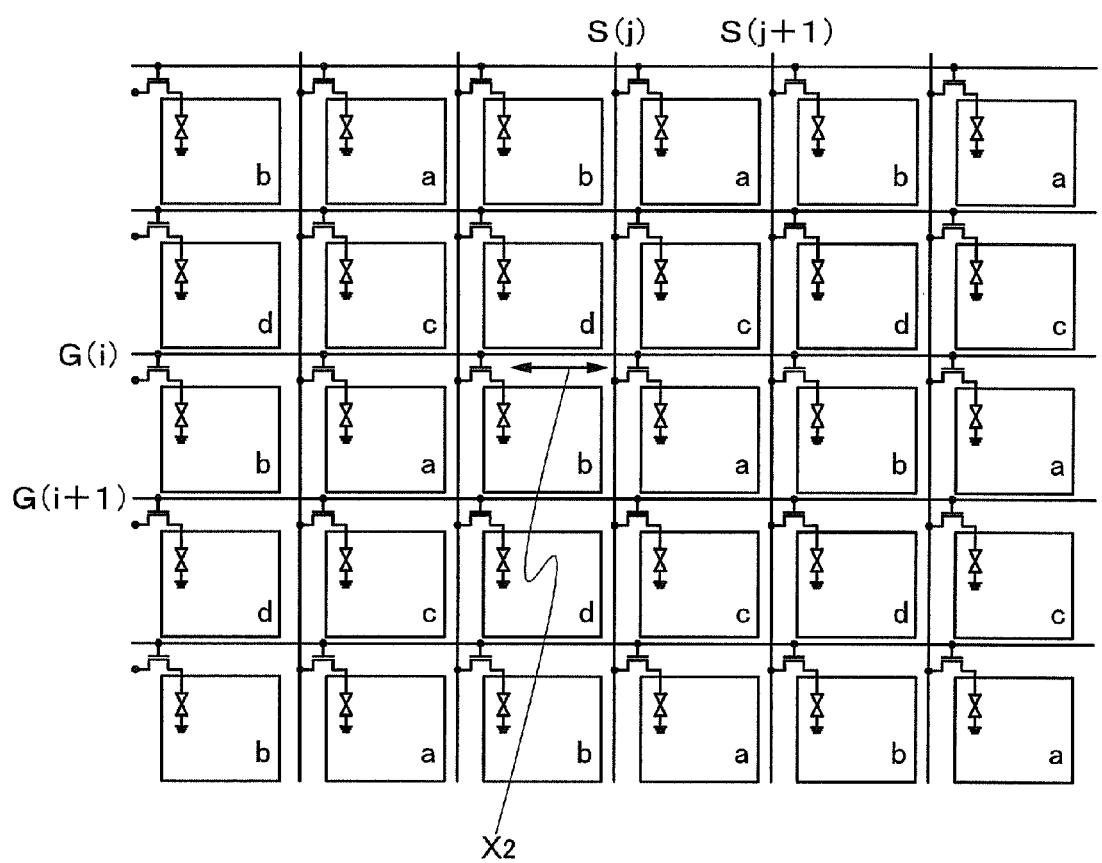
FIG. 9 is a schematic view illustrating a conventional pixel arrangement in a display portion.

Further, a wiring of the TFT is not overlapped with the scanning line and the signal line in FIG. 8 which is a top view. In the general manufacturing process, in order to avoid undesired connection between the scanning line and the signal line, an insulating layer is formed, and a contact hole is formed in the insulating layer, which is followed by the formation of a conductive layer to electrically contact the TFT with an appropriately selected scanning line or signal line. However, such a process is not required in the present embodiment mode.

Further, since a BM is formed so as to overlap the scanning line and the signal line formed in the pixel where the plurality of scanning lines, the plurality of signal lines, or the plurality of scanning lines and the plurality of signal lines are gathered as in the present invention, the total area of the margin provided in consideration of misplacement of a TFT substrate and an opposite substrate can be decreased. Accordingly, reduction of an aperture ratio due to misplacement can be suppressed.

By applying the above-described TFT arrangement, a plurality of thin film transistors each provided in the sub-pixels can be provided close to the intersection portion of the scanning line and the signal line. Therefore, the margin for alignment in formation of an SOI layer can be increased or reduction of the aperture ratio due to misplacement in bonding the TFT substrate and the opposite substrate can be suppressed.

Embodiment Mode 6

Figure 10:
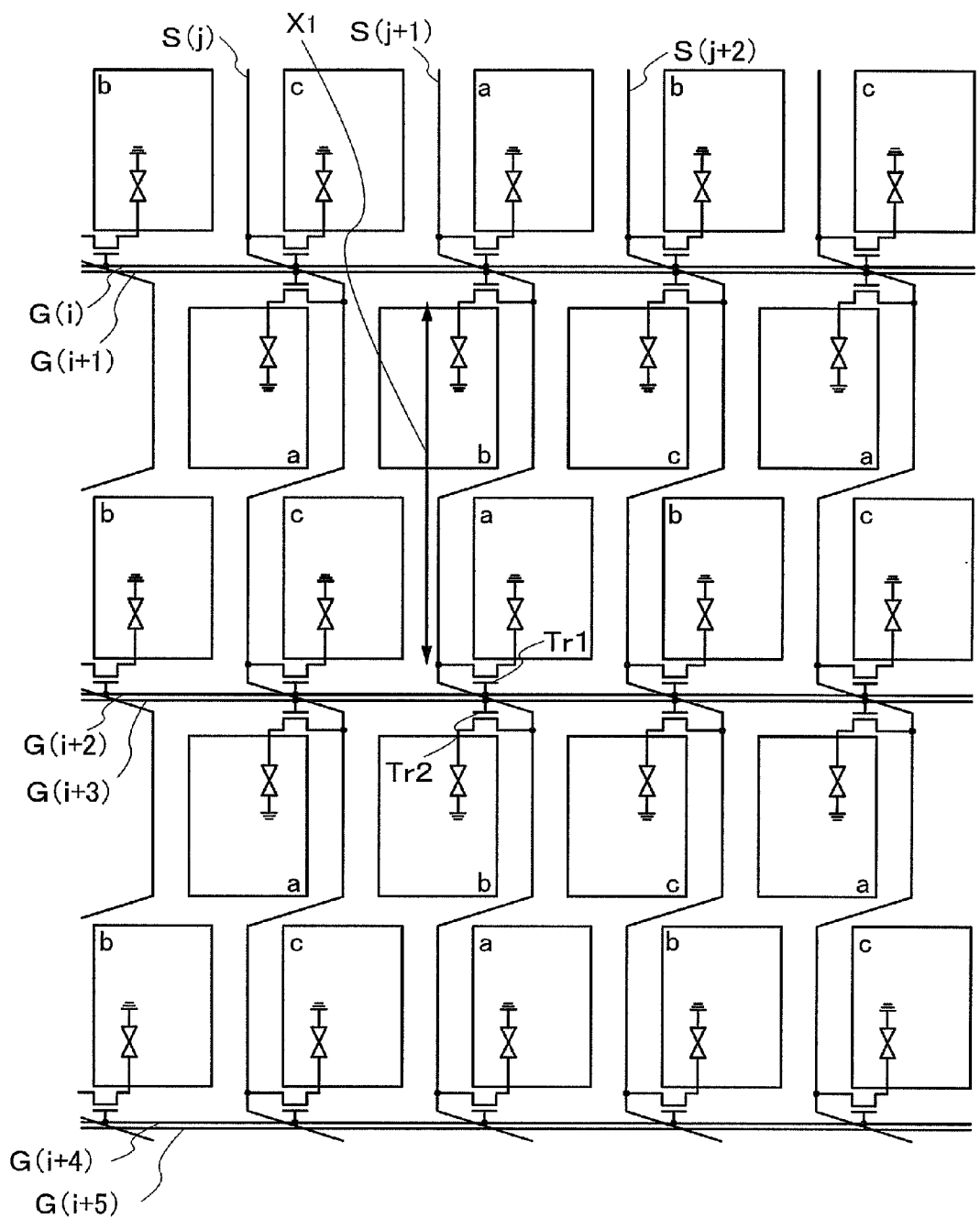
FIG. 10 is a schematic view illustrating a pixel arrangement of a display portion according to the present invention.

FIG. 10 is a view illustrating an example of a structure in which two TFTs are arranged in the periphery of an intersection portion of a scanning line and a signal line in an active matrix display device. A pixel of this embodiment mode has a structure in which three sub-pixels having a rectangular shape or a shape similar to rectangular shape, that is, "a" (also referred to as a first sub-pixel), "b" (also referred to as a second sub-pixel), and "c" (also referred to as a third sub-pixel) are arranged in a delta pattern and in which two scanning lines are close to each other and interposed between adjacent pixels.

Note that a specific structure of the sub-pixels "a", "b", and "c" is not limited. For example, R (red), G (green), and B (blue) can be applied to the three sub-pixels.

The first pixel comprises a first sub-pixel, and a TFT provided at the first sub-pixel that is arranged in a region surrounded by scanning lines G(i) and G(i+1), scanning lines G(i+2) and G(i+3), a signal line S(j+1), and a signal line S(j+2) is a Tr1 (also referred to as a first thin film transistor). The second pixel comprises a second sub-pixel, and a TFT provided at the second sub-pixel that is arranged in a region surrounded by the scanning lines G(i+2) and G(i+3), scanning lines G(i+4) and G(i+5), a signal line S(j), and the signal line S(j+1) is a Tr2 (also referred to as a second thin film transistor. The Tr1 is connected to the scanning line G(i+2) and the signal line S(j+1), and the Tr2 is connected to the scanning line G(i+3) and the signal line S(j+1). The same configuration is applied to other pixels, and two TFTs are arranged so as to be close to an intersection portion of two scanning lines and a signal line.

Note that although a structure in which the two scanning lines are gathered is illustrated in this embodiment mode, the two TFTs can be arranged close to the intersection portion of the scanning line and the signal line even in a structure in which two signal lines are gathered (not shown). Also, by gathering two scanning lines and two signal lines, a structure in which four TFTs are arranged close to the intersection portion of the scanning line and the signal line can be realized (not shown).

Figure 11:
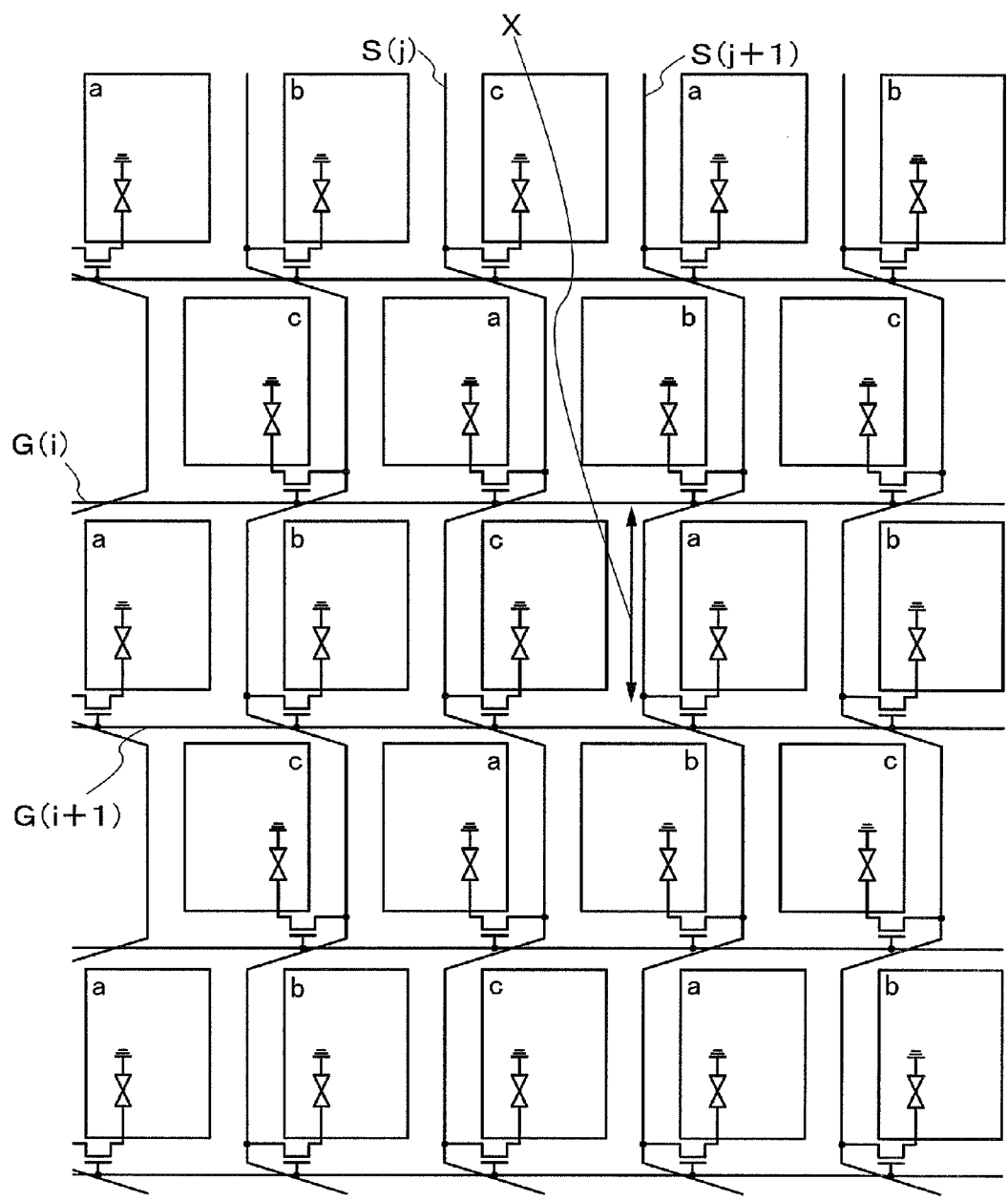
FIG. 11 is a schematic view illustrating a conventional pixel arrangement in a display portion.

According to this embodiment mode, the TFTs included in the sub-pixels of a display portion are arranged as illustrated in FIG. 10, whereby a distance $X_1$ between regions each provided with the TFTs can be approximately doubled compared to a distance $X_2$ in a conventional TFT arrangement in which all TFTs are arranged at a regular interval as illustrated in FIG. 11. Therefore, a margin for alignment in formation of an SOI layer is increased.

Further, since a BM is formed so as to overlap the scanning line and the signal line formed in the pixel where the plurality of scanning lines, the plurality of signal lines, or the plurality of scanning lines and the plurality of signal lines are gathered as in the present invention, the total area of the margin provided in consideration of misplacement of a TFT substrate and an opposite substrate can be decreased. Accordingly, reduction of an aperture ratio due to misplacement can be suppressed.

In addition, a wiring of the TFT is not overlapped with the scanning line and the signal line in FIG. 10 which is a top view. In the general manufacturing process, in order to avoid undesired connection between the scanning line and the signal line, an insulating layer is formed, and a contact hole is formed in the insulating layer, which is followed by the formation of a conductive layer to electrically contact the TFT with an appropriately selected scanning line or signal line. However, such a process is not required in the present embodiment mode.

By applying the above-described TFT arrangement, a plurality of thin film transistors each provided in the sub-pixels can be provided close to the intersection portion of the scanning line and the signal line. Therefore, the margin for alignment in formation of an SOI layer can be increased or reduction of the aperture ratio due to misplacement in bonding the TFT substrate and the opposite substrate can be suppressed.

Embodiment Mode 7

A method for manufacturing a transmissive liquid crystal display device including the TFT arrangement which is described in Embodiment Mode 1 to Embodiment Mode 6 will be described in this embodiment mode.

First, a process for forming a single crystal semiconductor thin film over a base substrate will be described with reference to FIGS. 14A to 14E. A silicon oxide film or a silicon oxynitride film is formed over a single crystal semiconductor substrate 100 which is processed to have a rectangular shape, and a silicon nitride film or a silicon nitride oxide is formed thereover. Here, a silicon oxynitride film 101 and a silicon nitride oxide film 102 are formed sequentially. At this time, the thickness of the silicon oxynitride film is preferably greater than or equal to 10 nm and less than or equal to 150 nm. Further, the thickness of the silicon nitride oxide film is preferably greater than or equal to 10 nm and less than or equal to 200 nm.

Note that the silicon oxynitride film 101 and the silicon nitride oxide film 102 are provided in order to prevent contamination of a single crystal semiconductor layer due to impurities such as sodium ions diffused from a base substrate 106. Here, the silicon nitride oxide film refers to a film that contains higher composition of nitrogen than oxygen and that includes oxygen, nitrogen, silicon, and hydrogen at concentrations ranging from 15 to 30 at. %, 20 to 35 at. %, 25 to 35 at. %, and 15 to 25 at. %, respectively, where the total of the concentrations is 100 at. %. The silicon oxynitride film refers to a film that contains higher composition of oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively, where the total of the concentrations is 100 at. %. Note that aluminum nitride, aluminum nitride oxide, or the like may also be used. The silicon oxynitride film 101 and the silicon nitride oxide film 102 are not necessarily provided, and a substrate in which only an ion implantation layer is formed by performing ion implantation on a single crystal semiconductor substrate to be described later may also be used.

Figure 14A:
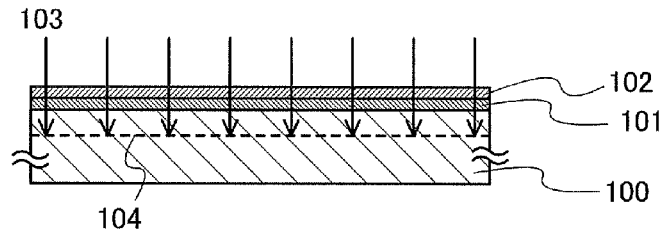
FIGS. 14A to 14E are cross-sectional views illustrating a process for manufacturing a display device according to the present invention.

Next, an ion implantation layer 104 is formed by implanting hydrogen ions 103 into the single crystal semiconductor substrate 100 (see FIG. 14A). This implantation of the hydrogen ions is performed in consideration of the thickness of the single crystal semiconductor layer to be transferred to the base substrate. The thickness of the single crystal semiconductor layer is set at 10 nm to 200 nm, and preferably 10 nm to 50 nm. An accelerating voltage for implanting hydrogen ions is set in consideration of the thickness. With this treatment, the ion implantation layer 104 is formed in a region at a predetermined depth from a surface of the single crystal semiconductor substrate 100. Note that the ion implantation layer 104 may be formed using hydrogen, a rare gas, or a mixture of hydrogen and a rare gas.

Figure 14B:
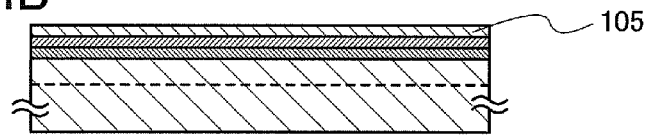

Next, a silicon oxide film 105 is formed over the silicon nitride oxide film 102 by a chemical vapor deposition (CVD) method or a plasma chemical vapor deposition (plasma CVD) method using a mixed gas of a TEOS gas and an oxygen gas (FIG. 14B). The silicon oxide film 105 may be formed before the ions are implanted to the single crystal semiconductor substrate 100. Note that when the silicon oxide film is formed by a CVD method or a plasma CVD method using a mixed gas of a TEOS gas and an oxygen gas, it is preferable that the thickness of the silicon oxide film is set to be greater than or equal to 10 nm and less than or equal to 800 nm.

Here, "TEOS gas" refers to a tetraethyl orthosilicate gas. When the silicon oxide film formed by a CVD method or a plasma CVD method using a mixed gas of a TEOS gas and an oxygen gas is provided at a bonding interface between the single crystal semiconductor substrate and a supporting substrate, adhesion between the substrates can be increased.

In the case where the silicon oxynitride film 101 or the silicon nitride oxide film 102 is not formed, it is preferable that an ultra-thin metal oxide film formed by the spontaneous oxidation, chemical oxidation, or UV irradiation under an atmosphere containing oxygen be formed over the surface of the single crystal semiconductor substrate 100. In a similar way, the above-mentioned oxide film is preferably formed before formation of the silicon oxynitride film 101 or the silicon nitride oxide film 102 over the single crystal semiconductor substrate 100. A chemically formed oxide film can be formed by treating the surface of the single crystal semiconductor substrate with oxidizer such as ozone-containing water, an aqueous solution of hydrogen peroxide, or sulfuric acid.

Figure 14C:
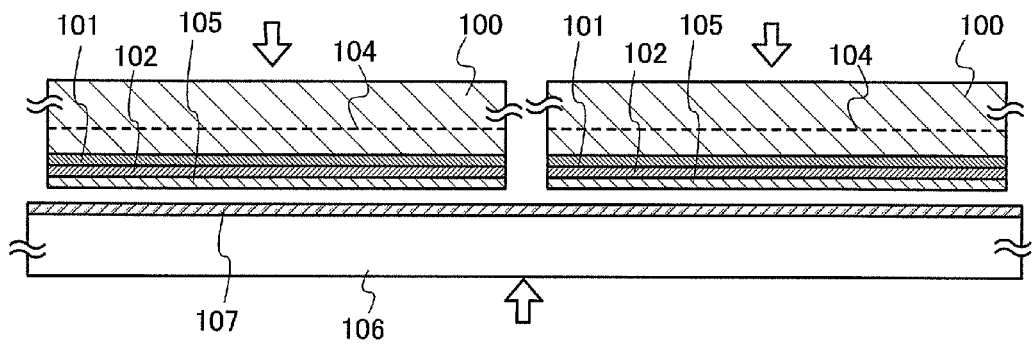

Then, a plurality of the single crystal semiconductor substrates 100 processed with the steps of FIG. 14A and 14B is prepared, and the base substrate 106 and the silicon oxide film 105 over the single crystal semiconductor substrate 100 are bonded to each other as illustrated in FIG. 14C. In order to simplify the drawing, the drawing illustrating a step for bonding two single crystal semiconductor substrates 100 is employed. Note that a base film 107 is formed over the surface of the base substrate 106. As the base film 107, a silicon oxide film formed by a CVD method or a plasma CVD method using a mixed gas of a TEOS gas and an oxygen gas is represented. By attaching the silicon oxide films 105 and 107 which is the base film to each other, the single crystal semiconductor substrates 100 and the base substrate 106 can be bonded to each other. Note that, although the base film 107 such as the silicon oxide film is not necessarily formed, it is preferably provided in order to improve adhesion of the substrates.

Since a substrate for the base substrate 106 is acceptable as long as the substrate has light-transmitting property, an insulating substrate such as a glass substrate or a quartz substrate can be used for the base substrate 106. In this embodiment mode, a glass substrate is used.

In this embodiment mode, the bond-formation is performed by attaching the silicon oxide film 105 formed on the single crystal semiconductor substrate 100 to the base film 107 formed over the base substrate 106. The bond can be formed at room temperature. This bonding takes place at the atomic level, and a strong bond is formed at room temperature due to interaction of the van der Waals force.

Figure 14D:
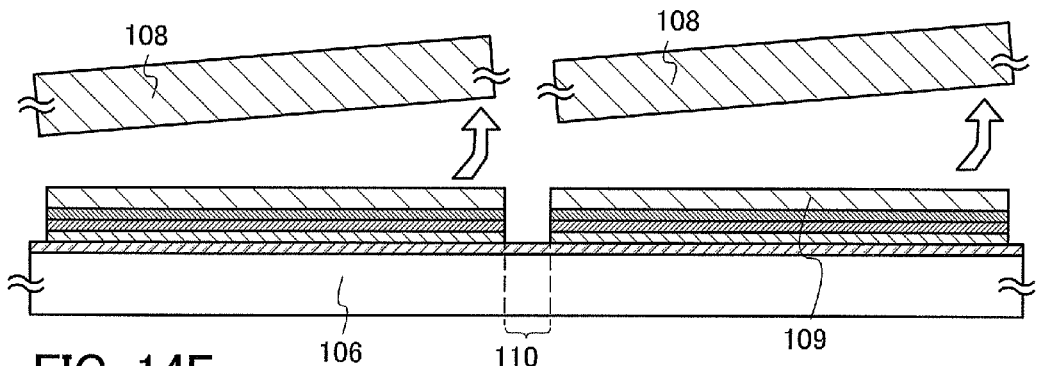

After the bond of the single crystal semiconductor substrates 100 and the base substrate 106 is formed, a part of the single crystal semiconductor layer (i.e., the single crystal semiconductor layer 108) is separated from the single crystal semiconductor substrates 100 (FIG. 14D). A change in volume of microvoids formed in the ion implantation layers 104 occurs upon heating, cleavage sections are generated along the ion implantation layer 104, and the single crystal semiconductor layer 108 can be separated (divided) along the cleavage sections. After that, heat treatment is preferably performed at 400° C. to 700° C. to increase the bond strength. In this manner, a single crystal semiconductor layer 109 is formed over the base substrate 106. Then, in order to planarize surfaces of the single crystal semiconductor layer 109, chemical mechanical polishing (CMP) is preferably performed.

As illustrated in FIG. 14D, as for the plurality of single crystal semiconductor layers 109 formed over the base substrate 106, joint portions 110 (gaps) are generated between the adjacent single crystal semiconductor layers. For example, when conventional TFT arrangement shown in FIG. 2, FIG. 4, FIG. 9, and FIG. 11 are used, since a distance between TFTs is small, it is extremely difficult to form all TFTs avoiding the joint portions 110. In contrast, the TFT arrangement described in Embodiment Mode 1 to Embodiment Mode 6 makes it possible to arrange TFTs efficiently avoiding the joint portions 110.

Figure 14E:
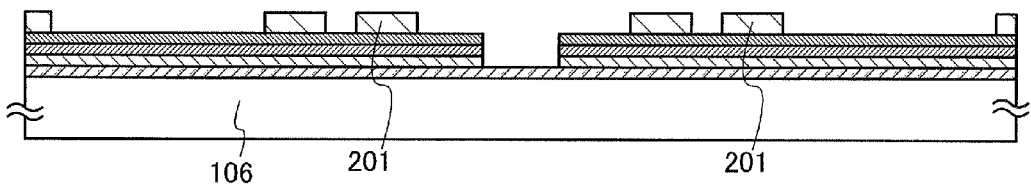

Next, a resist is formed over the single crystal semiconductor layer 109. By etching the single crystal semiconductor layer 109 using the resist as a mask, island-shaped single crystal semiconductor layers 201 are formed (FIG. 14E).

Figure 15:
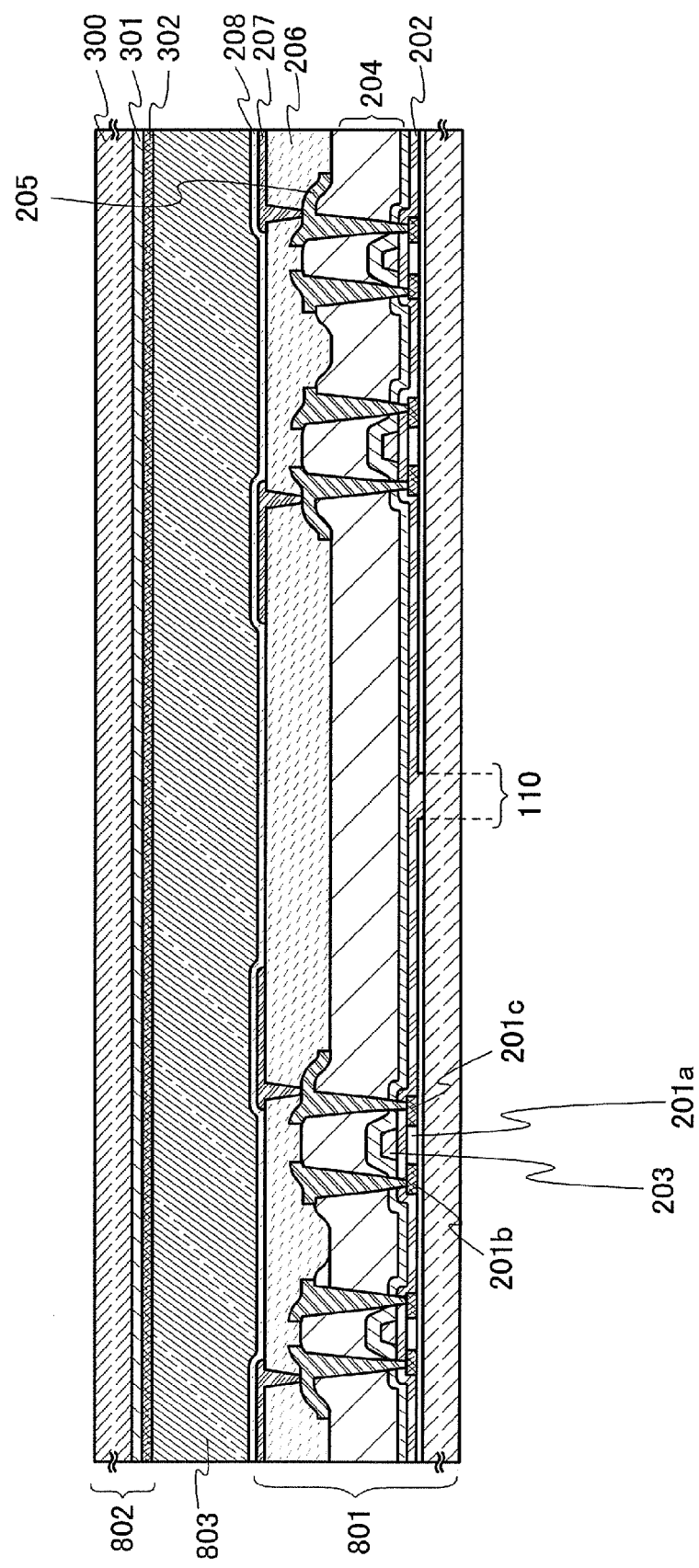
FIG. 15 is a cross-sectional view illustrating a display device according to the present invention.

Hereinafter, a process for forming a TFT and manufacturing a liquid crystal display device will be described with use of FIG. 15.

A first insulating layer 202 which covers the island-shaped single crystal semiconductor layers 201 is formed. The first insulating layer 202 is formed of an insulating film containing silicon with a thickness of 10 nm to 150 nm by a plasma CVD method, a sputtering method, or the like. The first insulating layer 202 may be formed of a material such as an oxide or nitride of silicon, typified by silicon nitride, silicon oxide, silicon oxynitride, and silicon nitride oxide and may be a stacked layer or a single layer. Further, the insulating layer may be a stacked layer of three layers including a silicon nitride film, a silicon oxide film, and a silicon nitride film, a single layer of a silicon oxynitride film, or a stacked layer of two silicon oxynitride films. A silicon nitride oxide with dense film quality is preferably used. Further, a thin silicon oxide film with a thickness of 1 to 100 nm, preferably 1 to 10 nm, and more preferably 2 to 5 nm may be formed between the island-shaped single crystal semiconductor layer 201 and the first insulating layer 202. A thermally induced oxidation is represented as a method for forming the thin silicon oxide film, in which a semiconductor surface of a semiconductor region is oxidized by a GRTA method, an LRTA method, or the like, thereby forming a thin silicon oxide film. Note that it is preferable to allow the insulating film to include a rare gas element such as argon by adding the rare gas element to the reactive gas in order to form a dense insulating film with negligible gate leak current at a low film-formation temperature. The first insulating layer 202 functions as a gate insulating layer.

Then, a first conductive layer 203 functioning as a gate electrode or a connection electrode is formed over the first insulating layer 202. In this embodiment mode, an example in which the first conductive layer 203 is formed of a single layer is illustrated; however, the first conductive layer 203 may have a structure in which two, three or more layers of conductive materials are stacked. Note that the first conductive layer 203 is formed by selectively etching a conductive layer which is formed so as to cover the first insulating layer 202.

The first conductive layer 203 can be formed using an element selected from tantalum (Ta), tungsten (W), titanium (Ti), molybdenum (Mo), aluminum (Al), copper (Cu), chromium (Cr), niobium (Nb), and the like, or an alloy or a compound containing such an element as a main component. Further, a semiconductor material typified by polycrystalline silicon doped with an impurity element such as phosphorus can also be used. For example, when the first conductive layer 203 formed to have a stacked layer structure, tantalum nitride may be used as a first layer and tungsten may be used as a second layer. Note that the first conductive layer 203 is not limited to this combination and can be provided by freely combining any of the materials described above.

Then, impurity regions 201b and 201c, and a channel region 201a to which an impurity element is not added are formed in the island-shaped single crystal semiconductor layer 201 by adding an impurity element into the island-shaped single crystal semiconductor layer 201 using the first conductive layer 203 as a mask. Here, an impurity element is added after the first conductive layer 203 is formed so as to cross the island-shaped single crystal semiconductor layer 201. Thus, the impurity regions 201b and 201c are formed by adding an impurity to a region which is not covered with the first conductive layer 203. The channel region 201a to which an impurity element is not added is formed in the region which is covered with the first conductive layer 203.

In this embodiment mode, an impurity element which imparts n-type conductivity or an impurity element which imparts p-type conductivity can be used for the impurity element. As the impurity element imparting n-type conductivity, phosphorus (P), arsenic (As), or the like can be used. As the impurity element imparting p-type conductivity, boron (B), aluminum (Al), gallium (Ga), or the like can be used. For example, phosphorus (P) can be used as the impurity element and introduced into the island-shaped single crystal semiconductor layer 201 at a concentration of $1\times10^{18}$ to $1\times10^{21}$ atoms/cm$^3$ to form the impurity regions 201b and 201c which have n-type conductivity. Note that a lightly-doped drain region (an LDD region) to which an impurity is added at a lower concentration than the impurity regions 201b and 201c that function as a source or drain region may be formed between the channel region 201a and the impurity regions 201b and 201c.

Next, a second insulating layer 204 is formed so as to cover the first conductive layer 203 and the first insulating layer 202. Here, as the second insulating layer 204, silicon oxide, silicon oxynitride ($SiO_xN_y$, where x>y>0), silicon nitride oxide ($SiN_xO_y$, where x>y>0), or the like, which is formed by a CVD method, a sputtering method, or the like, can be used. Alternatively, the second insulating layer 204 can be formed to have a single layer structure or a stacked layer structure including an organic material such as polyimide, polyamide, poly(vinylphenol), benzocyclobutene-based resin, acrylic, or epoxy; a siloxane material such as a siloxane resin; oxazole resin; and the like. Note that the siloxane material is a material having a Si—O—Si bond. Siloxane has a skeleton formed from a bond of silicon (Si) and oxygen (O). As a substituent, an organic group (for example, an alkyl group or aromatic hydrocarbon), or a fluoro group may be used. The organic group may contain a fluoro group. An oxazole resin is a photosensitive polybenzoxazole or the like, for example. A photosensitive polybenzoxazole is a material which has a low dielectric constant (a dielectric constant of 2.9 at 1 MHz at room temperature), high heat resistance (according to results of thermogravimetry-differential thermal analysis (TG-DTA) at a rate of temperature increase of 5° C./min, it has a thermal decomposition temperature of 550° C.), and a low rate of water absorption (0.3% at room temperature over 24 hours). Compared with a dielectric constant of polyimide or the like (approximately 3.2 to 3.4), an oxazole resin has a lower dielectric constant (approximately 2.9). Therefore, when an oxazole resin is used, generation of parasitic capacitance can be suppressed and high-speed operation can be performed. In this embodiment mode, a single layer structure or a stacked layer structure including silicon oxide, silicon oxynitride ($SiO_xN_y$, where x>y>0), and/or silicon nitride oxide ($SiN_xO_y$, where x>y>0) which are formed by a CVD method is provided as the second insulating layer 204. Further, the second insulating layer 204 may be formed as a stacked layer of an organic material such as polyimide, polyamide, poly(vinylphenol), benzocyclobutene-based resin, acrylic, or epoxy; a siloxane material such as a siloxane resin; or an oxazole resin. Next, a resist is formed over the second insulating layer 204 selectively. As the resist, a positive photoresist, a negative photoresist, or the like can be selected as appropriate.

Then, the second insulating layer 204 and the first insulating layer 202 are etched by dry etching using the resist as a mask to form contact holes which reach the island-shaped single crystal semiconductor layer 201. There is no particular limitation on an etching gas in the dry etching as long as the etching gas provides high etching selectivity of the second insulating layer 204 and the first insulating layer 202 with respect to the semiconductor layer so that the semiconductor layer is not etched. For example, a fluorine-based gas such as $CF_4$, $NF_3$, $SF_6$, $CHF_3$, or $CF_4$; a mixed gas in which $O_2$ gas, $H_2$ gas, or an inert gas such as He or Ar is added as appropriate to a fluorine-based gas; or the like can be used. Preferably, a mixed gas containing $CHF_3$ and He, a mixed gas containing $CF_4$ and $O_2$, or a mixed gas containing $CHF_3$, He, and $H_2$ is used.

The contact holes formed in the second insulating layer 204 and the first insulating layer 202 are filled with a conductive material, resulting in a second conductive layer 205 which is connected electrically to the impurity regions 201b and 201b of the island-shaped single crystal semiconductor layer 201 at a surface therebetween. Note that the second conductive layer 205 can be formed by selectively etching a conductive layer which is formed so as to cover the second insulating layer 204.

Then, a third insulating layer 206 is formed so as to cover the second insulating layer 204 and the second conductive layer 205. The third insulating layer 206 can be formed of a material selected from silicon oxide, silicon nitride, silicon oxynitride, silicon nitride oxide, aluminum nitride, aluminum oxynitride (AlON), aluminum nitride oxide (AlNO) containing higher composition of nitrogen than oxygen, aluminum oxide, diamond-like carbon (DLC), a nitrogen-containing carbon film (CN), phosphosilicate glass (PSG), borophosphosilicate glass (BPSG), an alumina film, polysilazane, or another substance containing an inorganic insulating material. Further, a siloxane resin may be used as well. Further, an organic insulating material may be used. An organic material may be either photosensitive or non-photosensitive, and polyimide, acrylic, polyamide, polyimideamide, a resist, or benzocyclobutene-based resin can be used.

In this embodiment mode, the third insulating layer 206 is preferably formed by using a spin coating method or the like.

Next, a resist is formed over the third insulating layer 206 selectively, and etching is performed on the third insulating layer 206 using the resist as a mask, whereby contact holes reaching the second conductive layer 205 are formed. Then, a pixel electrode 207 connected to the second conductive layer 205 electrically is formed over the third insulating layer 206. Further, an orientation film 208 is formed over the third insulating layer 206 and the pixel electrode 207.

Subsequently, an opposite substrate 802 is prepared. The opposite substrate 802 includes a glass substrate 300, an opposite electrode 301 formed of a transparent conductive film, and an orientation film 302.

Then, a TFT substrate 801 obtained through the above-described process and the opposite substrate 802 are bonded to each other with a sealant interposed therebetween. Here, a spacer may be provided between the orientation film 208 and the orientation film 302 to keep a constant space between the both substrates. After that, liquid crystal 803 is injected between the both substrates and the both substrates are sealed with a sealing material, whereby a transmissive liquid crystal display device as illustrated in FIG. 15 is completed.

In accordance with the present invention, increase of a margin for alignment in formation of an SOI layer, improvement of productivity, and reduction of a display defect can be realized. In other words, a display device with high reliability can be manufactured.

A transmissive liquid crystal display device is described in this embodiment mode. However, a display device to which the present invention is applied is not limited to the transmissive liquid crystal display device. For example, the present invention can also be applied to a reflective liquid crystal display device by using an electrode layer having reflectivity as the pixel electrode 207, or by providing a reflective film for an upper surface or a bottom surface of the pixel electrode 207. Also, the present invention can be applied to a display device including an electroluminescent element (an EL display device).

Embodiment Mode 8

Figure 16A:
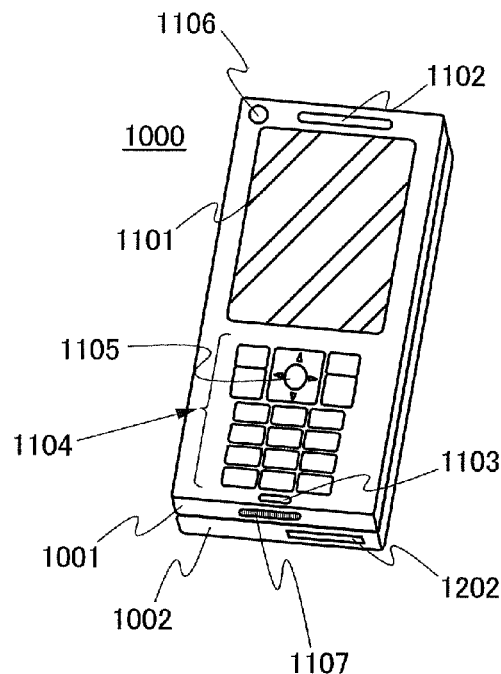
FIGS. 16A to 16C are views illustrating a structure of a display device according to the present invention.
Figure 16B:
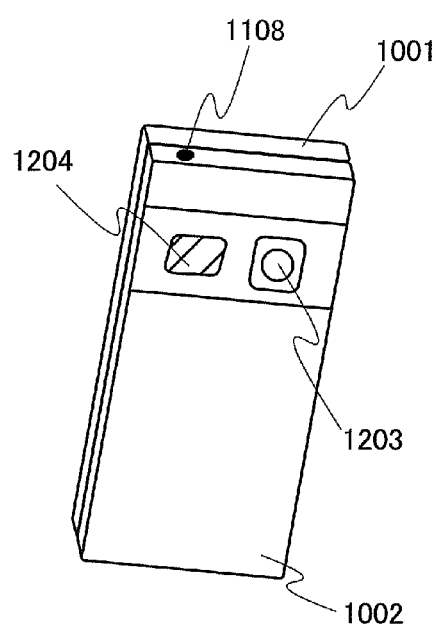
Figure 16C:
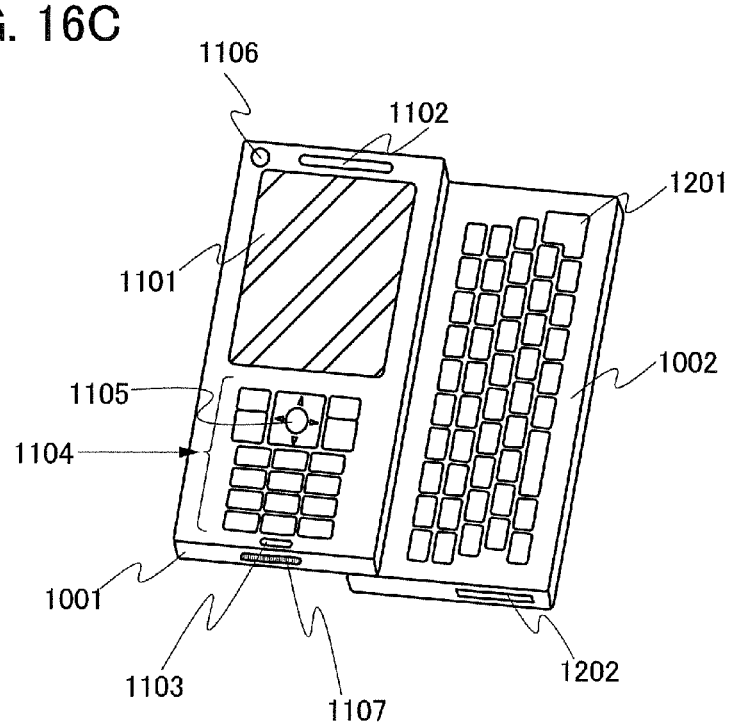

FIGS. 16A to 16C exemplifies a structure of a mobile phone 1000 according to the present invention. FIG. 16A is a front view, FIG. 16B is a rear view, and FIG. 16C is a development view. The mobile phone 1000 is a so-called smart-phone which has both functions of a mobile phone and a portable information terminal, is incorporated with a computer, and can perform a variety of data processing in addition to voice calls.

The mobile phone 1000 includes two housings 1001 and 1002. The housing 1001 includes a display portion 1101, a speaker 1102, a microphone 1103, operation keys 1104, a pointing device 1105, a camera lens 1106, an external connection terminal 1107, and the like, while the housing 1002 includes a keyboard 1201, an external memory slot 1202, a camera lens 1203, a light 1204, an earphone terminal 1108, and the like. In addition, an antenna is incorporated in the housing 1001.

Further, in addition to the above structure, the mobile phone 1000 may incorporate a non-contact IC chip, a small size memory device, or the like.

The display device described in the above embodiment mode can be incorporated in the display portion 1101, and display direction can be changed depending on a usage pattern. The mobile phone 1000 is provided with the camera lens 1106 on the same surface as the display portion 1101, and thus it can be used as a video phone. Further, a still image and a moving image can be taken with the camera lens 1203 and the light 1204 by using the display portion 1101 as a viewfinder. The speaker 1102 and the microphone 1103 are not limited to use for verbal communication, and can be used for a video-phone, recording, reproduction, and the like. With use of the operation keys 1104, operation of incoming and outgoing calls, easy input of information such as electronic mails or the like, scrolling of a screen, cursor motion and the like are possible. Furthermore, the housing 1001 and the housing 1002 (FIG. 16A), which are overlapped with each other, are slid to expose the housing 1002 as illustrated in FIG. 16C, and can be used as a portable information terminal. In this case, smooth operation is possible with use of the keyboard 1201 and the pointing device 1105. The external connection terminal 1107 can be connected to an AC adapter and various types of cables such as a USB cable, and charging and data communication with a personal computer are possible. Moreover, a large amount of data can be stored and transferred by using a storage medium inserted into the external memory slot 1202.

Further, in addition to the above-described functions, the mobile phone 1000 may also have an infrared communication function, a television reception function, or the like.

The display device with a reduced number of display defect and high reliability can be manufactured in accordance with the present invention.

This application is based on Japanese Patent Application serial no. 2007-312546 filed with Japan Patent Office on Dec. 3, 2007, the entire contents of which are hereby incorporated by reference.

The invention claimed is:

1. A display device comprising:
a substrate;
first and second scanning lines formed over the substrate;
first to third signal lines formed over the substrate, the second signal line being located between the first and third signal lines; and
a pixel having first to third sub-pixels formed over the substrate, the pixel being provided in a region surrounded by the second signal line, the third signal line, the first scanning line, and the second scanning line,
wherein the second sub-pixel is located between the first and third sub-pixels,
wherein the first and second scanning lines each intersect with the first to third signal lines,
wherein the first sub-pixel has a first thin film transistor connected to the second scanning line and the second signal line,
wherein the second sub-pixel has a second thin film transistor connected to the first scanning line and the first signal line,
wherein the third sub-pixel has a third thin film transistor connected to the first scanning line and the third signal line,
wherein the first thin film transistor is nearer to the second scanning line than the first scanning line and nearer to the second signal line than the third signal line,
wherein the second thin film transistor is nearer to the first scanning line than the second scanning line and nearer to the second signal line than the third signal line, and
wherein the third thin film transistor is nearer to the first scanning line than the second scanning line and nearer to the third signal line than the second signal line.

2. The display device according to claim 1,
wherein the first to third sub-pixels exhibit different colors from each other.

3. The display device according to claim 1,
wherein the first to third thin film transistors each have a single crystal semiconductor layer.

4. The display device according to claim 1,
wherein each of the first to third sub-pixels has a pixel electrode, and
wherein each of the first to third thin film transistors is connected to the pixel electrode.

5. The display device according to claim 1,
wherein the first to third thin film transistors each have a single crystal semiconductor layer,
wherein the display device further comprises:
a base film between the substrate and the first to third thin film transistors; and
an insulating layer which covers the single crystal semiconductor layer and is in contact with the single crystal semiconductor layer, and
wherein the base film has a gap in which the insulating layer and the substrate are in contact with each other.

6. A display device comprising:
a substrate;
first to third pixels over the substrate, the first to third pixels being adjacent to each other;
a scanning line formed between the first and second pixels; and
first to third signal lines formed between the second and third pixels,
wherein the scanning line intersects with the first to third signal lines,
wherein the first to third pixels each have first to third sub-pixels,
wherein the first sub-pixel in the first pixel has a first thin film transistor connected to the scanning line and the first signal line,
wherein the second sub-pixel in the second pixel has a second thin film transistor connected to the scanning line and the second signal line,
wherein the third sub-pixel in the third pixel has a third thin film transistor connected to the scanning line and the third signal line.

7. The display device according to claim 6,
wherein the first to third thin film transistors are arranged close to an intersection portion of the scanning line and the first to third signal lines.

8. The display device according to claim 6,
wherein the first sub-pixel in the first pixel, the second sub-pixel in the second pixel, and the third sub-pixel in the third pixel exhibit different colors from each other.

9. The display device according to claim 6,
wherein the first to third thin film transistors each have a single crystal semiconductor layer.

10. The display device according to claim 6,
wherein each of the first to third sub-pixels has a pixel electrode, and
wherein each of the first to third thin film transistors is connected to the pixel electrode.

11. The display device according to claim 6,
wherein the first to third thin film transistors each have a single crystal semiconductor layer,
wherein the display device further comprises:
a base film between the substrate and the first to third thin film transistors; and
an insulating layer which covers the single crystal semiconductor layer and is in contact with the single crystal semiconductor layer, and
wherein the base film has a gap in which the insulating layer and the substrate are in contact with each other.

* * * * *